(12) United States Patent
Kawano

(10) Patent No.: US 11,988,375 B2
(45) Date of Patent: May 21, 2024

(54) LIGHT SOURCE UNIT, LIGHT SOURCE MODULE, AND LIGHTING DEVICE

(71) Applicant: NICHIA CORPORATION, Anan (JP)

(72) Inventor: Yohei Kawano, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/769,316

(22) PCT Filed: Oct. 6, 2020

(86) PCT No.: PCT/JP2020/037842
§ 371 (c)(1),
(2) Date: Apr. 14, 2022

(87) PCT Pub. No.: WO2021/095399
PCT Pub. Date: May 20, 2021

(65) Prior Publication Data
US 2024/0125456 A1    Apr. 18, 2024

(30) Foreign Application Priority Data

Nov. 14, 2019 (JP) ................... 2019-206387

(51) Int. Cl.
*F21V 5/04* (2006.01)
*F21V 7/00* (2006.01)
(Continued)

(52) U.S. Cl.
CPC ............ *F21V 5/043* (2013.01); *F21V 7/0033* (2013.01); *F21V 11/00* (2013.01); *F21V 13/04* (2013.01);
(Continued)

(58) Field of Classification Search
CPC ........ F21V 5/043; F21V 7/0033; F21V 11/00; F21V 13/04
See application file for complete search history.

(56) References Cited

U.S. PATENT DOCUMENTS 6,527,411 B1 * 3/2003 Sayers .................... F21S 41/24
362/555
7,618,171 B2 * 11/2009 Tessnow ............... F21S 41/143
362/545

(Continued)

FOREIGN PATENT DOCUMENTS

CN      209370897 U      9/2019
JP      2006-195382      7/2006
(Continued)

*Primary Examiner* — Arman B Fallahkhair
(74) *Attorney, Agent, or Firm* — MORI & WARD, LLP

(57) ABSTRACT

A light source unit includes light-emitting elements, a light-shielding body, and a rod lens including a first end surface, a second end surface, and a side surface. The light-shielding body is separated from the side surface, covers the side surface, includes an opening exposing at least a portion of the second end surface, and includes a tip protruding further than the second end surface in a first direction from the first end surface toward the second end surface. A first plane crosses the first direction and is at the same first-direction position as the tip. A second plane crosses the first direction and is at the same position as the second end surface or between the tip and second end surface in the first direction. A first surface area of the opening at the first plane is greater than a second surface area of the opening at the second plane.

20 Claims, 13 Drawing Sheets

(51) Int. Cl.
*F21V 11/00* (2015.01)
*F21V 13/04* (2006.01)
*F21W 131/202* (2006.01)
*F21Y 113/13* (2016.01)
*F21Y 115/10* (2016.01)

(52) U.S. Cl.
CPC .... *F21W 2131/202* (2013.01); *F21Y 2113/13* (2016.08); *F21Y 2115/10* (2016.08)

(56) References Cited

U.S. PATENT DOCUMENTS

| | | | | |
|---|---|---|---|---|
| 9,423,101 | B2* | 8/2016 | Holten | F21V 5/00 |
| 9,890,926 | B2* | 2/2018 | Preston | F21V 13/04 |
| 10,775,554 | B2* | 9/2020 | Kawano | G02B 5/0221 |
| 10,982,835 | B2* | 4/2021 | Shima | F21V 5/04 |
| 2005/0265040 | A1* | 12/2005 | Lin | F21S 41/285 |
| | | | | 362/545 |
| 2009/0251897 | A1* | 10/2009 | Kabuki | G02B 6/0018 |
| | | | | 362/235 |
| 2010/0283369 | A1* | 11/2010 | Chen | F21V 29/763 |
| | | | | 313/1 |
| 2015/0212263 | A1* | 7/2015 | Tzeng | G02B 6/0096 |
| | | | | 362/555 |
| 2016/0085142 | A1 | 3/2016 | Hirata | |
| 2018/0245771 | A1* | 8/2018 | Liu | F21V 5/04 |
| 2019/0113677 | A1 | 4/2019 | Kawano | |
| 2019/0293261 | A1* | 9/2019 | Jiang | F21V 5/008 |

FOREIGN PATENT DOCUMENTS

| | | |
|---|---|---|
| JP | 2012-086620 | 5/2012 |
| JP | 2015-022986 | 2/2015 |
| JP | 2015-076308 | 4/2015 |
| JP | 2015-156295 | 8/2015 |
| JP | 2015-159028 | 9/2015 |
| JP | 2015-162438 | 9/2015 |
| JP | 2019-008944 | 1/2019 |
| JP | 2019-075297 | 5/2019 |
| JP | 2019-186139 | 10/2019 |
| WO | WO 2014/155675 | 10/2014 |

* cited by examiner

LIGHT SOURCE UNIT, LIGHT SOURCE MODULE, AND LIGHTING DEVICE

TECHNICAL FIELD

Embodiments relate to a light source unit, a light source module, and a lighting device.

BACKGROUND ART

Conventionally, as shown in Patent Literature 1, a light source unit that includes a light-emitting element and a rod lens is known. Light that is emitted from the light-emitting element is incident on a first end surface of the rod lens. The light that enters the rod lens repeats total internal reflections and is emitted from a second end surface of the rod lens that is positioned at the side opposite to the first end surface. When the number of light-emitting elements is increased to obtain the desired illuminance and the rod lens is accordingly enlarged in such a light source unit, the light that is emitted from the rod lens may stray from the desired illumination region.

PRIOR ART DOCUMENTS

Patent Literature

[Patent Literature 1]
Japanese Patent Application 2019-8944 (Kokai)

SUMMARY OF INVENTION

Technical Problem

An embodiment of the invention is directed to provide a light source unit, a light source module, and a lighting device that can precisely control the illumination region while realizing the desired illuminance.

Solution to Problem

A light source unit according to an embodiment of the invention includes: a first light-emitting element and a second light-emitting element; a rod lens that includes a first end surface on which light emitted from the first and second light-emitting elements is incident, a second end surface positioned at a side opposite to the first end surface, and a side surface positioned between the first end surface and the second end surface, wherein a surface area of the second end surface is less than a surface area of the first end surface; and a light-shielding body that is separated from the side surface and covers the side surface, and in which an opening that exposes at least a portion of the second end surface is provided. The light-shielding body includes a tip that protrudes further than the second end surface in a first direction that is from the first end surface toward the second end surface. A first plane that crosses the first direction is positioned at the same position as the tip in the first direction. A second plane that crosses the first direction is positioned at the same position as the second end surface or between the tip and the second end surface in the first direction. A first surface area of the opening at the first plane is greater than a second surface area of the opening at the second plane.

A light source module according to an embodiment of the invention includes the aforementioned light source unit, and an optical member that projects the light emitted from the light source unit.

A lighting device according to an embodiment of the invention includes the aforementioned light source module, and a holding member that holds the light source module.

Advantageous Effects of Invention

According to embodiments of the invention, a light source unit, a light source module, and a lighting device can be realized in which the illumination region can be precisely controlled while realizing the desired illuminance.

DESCRIPTION OF EMBODIMENTS

First Embodiment

Figure 1:
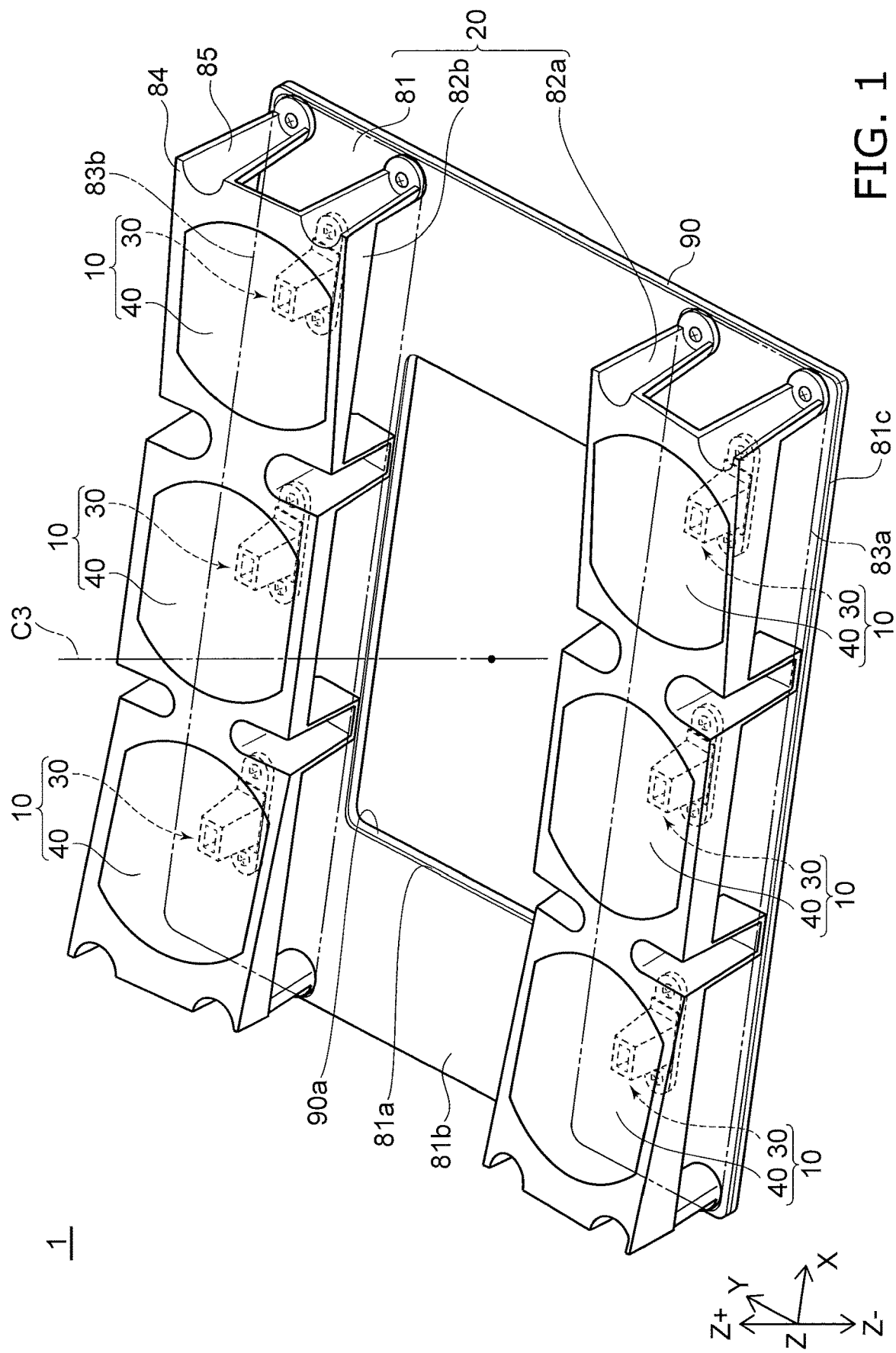
FIG. 1 is a perspective view showing a lighting device according to a first embodiment.

FIG. 1 is a perspective view showing a lighting device according to the embodiment.

Figure 2:
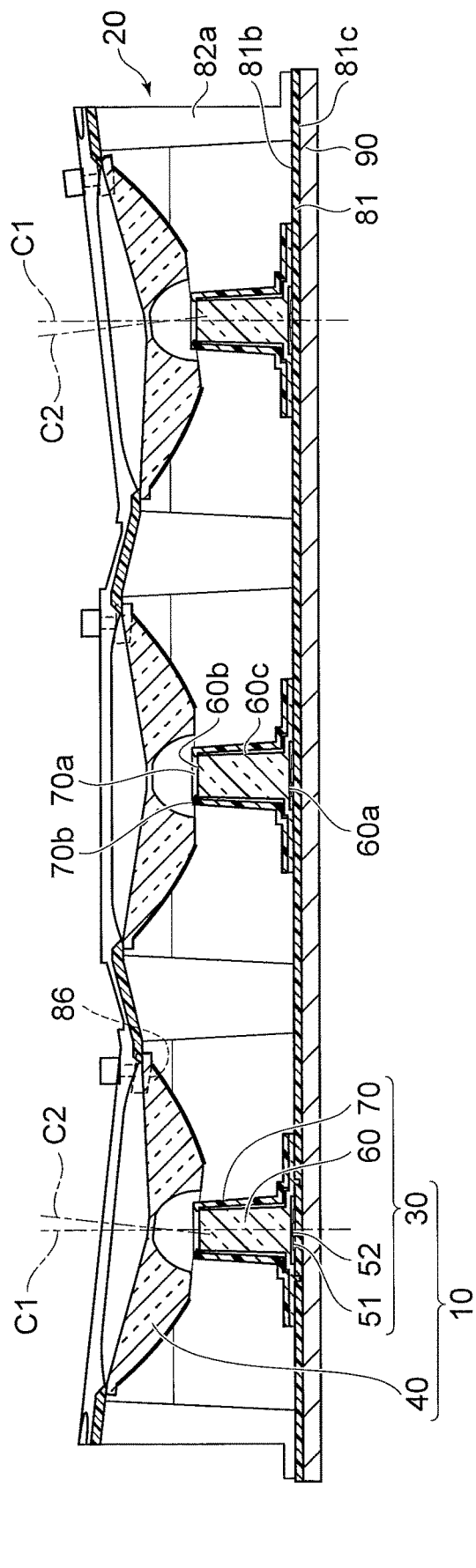
FIG. 2 is a cross-sectional view showing the lighting device according to the first embodiment.

FIG. 2 is a cross-sectional view showing the lighting device according to the embodiment.

Figure 3:
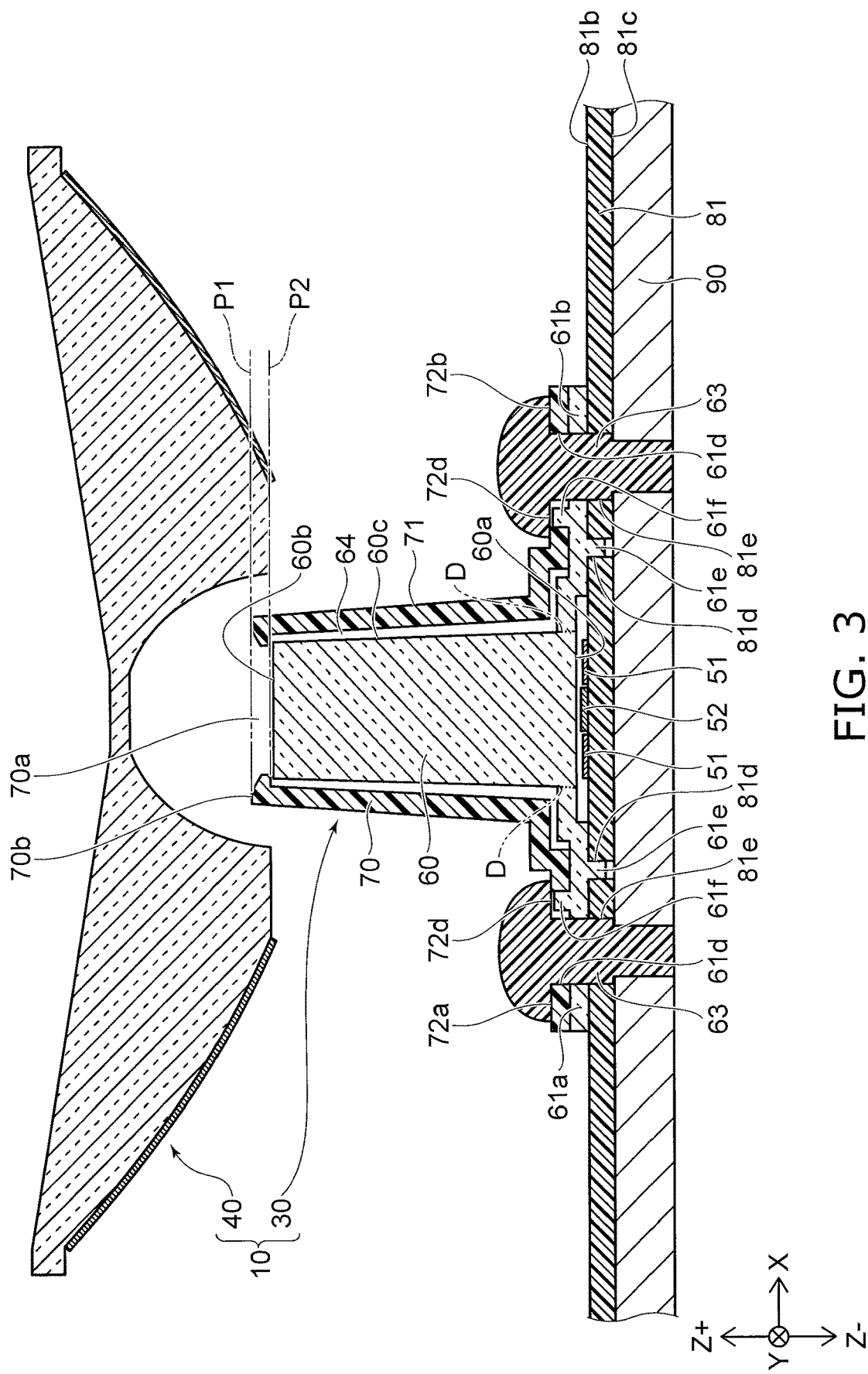
FIG. 3 is an end view showing the light source module according to the first embodiment.

FIG. 3 is an end view showing a light source module according to the embodiment.

As shown in FIG. 1, the lighting device 1 includes multiple light source modules 10, and a holding member 20 that holds the multiple light source modules 10. As shown in FIG. 2, each light source module 10 includes a light source unit 30 and an optical member 40. The light source unit 30 includes a first light-emitting element 51, a second light-emitting element 52, a rod lens 60, and a light-shielding body 70.

An XYZ orthogonal coordinate system is employed in the specification hereinbelow for convenience of description. A substrate 81 that is included in the holding member 20 described below is located on the XY plane. The longitudinal direction of the substrate 81 is taken as an "X-direction"; and the transverse direction of the substrate 81 is taken as a "Y-direction". A direction orthogonal to the X-direction and the Y-direction is taken as a "Z"-direction.

As shown in FIG. 3, the rod lens 60 includes a first end surface 60a on which the light emitted from the first and second light-emitting elements 51 and 52 is incident, a second end surface 60b positioned at the side opposite to the first end surface 60a, and a side surface 60c positioned between the first end surface 60a and the second end surface 60b. The surface area of the second end surface 60b is less than the surface area of the first end surface 60a.

Hereinbelow, the direction from the first end surface 60a toward the second end surface 60b of the rod lens 60 is taken as a "first direction Z+"; and the opposite direction is taken as a "second direction Z−". Also, viewing the components of the lighting device 1 in the second direction Z− is called "when viewed in top-view". The first direction Z+ is, for example, the same as a direction in the Z-direction from the substrate 81 toward the rod lens 60. The "first direction Z+" is, for example, the direction from the center of the first end surface 60a toward the center of the second end surface 60b. "The center of the first end surface 60a" is the intersection of the diagonal lines when the first end surface 60a is rectangular. The center of the second end surface 60b also is similar. The "first end surface 60a" is the surface among the surfaces of the rod lens 60 that is surrounded with the second direction Z− edges of the side surfaces 60c of the rod lens 60 or the second direction Z− edges of surfaces D of the side surfaces 60c extended to the surface of the rod lens 60 that faces the first light-emitting element 51 and the second light-emitting element 52.

An opening 70a that exposes at least a portion of the second end surface 60b is provided in the light-shielding body 70. The light-shielding body 70 is separated from the side surface 60c and covers the side surface 60c. The light-shielding body 70 includes a tip 70b that protrudes further than the second end surface 60b in the first direction Z+ that is from the first end surface 60a toward the second end surface 60b. The "tip 70b" means a point, line, or region positioned at the position furthest from the second end surface 60b in the first direction Z+, and does not have a thickness in the first direction Z+.

A first plane P1 that crosses the first direction Z+ is positioned at the same position as the tip 70b in the first direction Z+. A second plane P2 that crosses the first direction Z+ is positioned at the same position as the second end surface 60b in the first direction Z+ or between the tip 70b and the second end surface 60b. The first surface area of the opening 70a at the first plane P1 is greater than the second surface area of the opening 70a at the second plane P2. The "opening 70a" means the portion of the interior of the light-shielding body 70 from the same position as the second end surface 60b in the first direction Z+ to the same position as the tip 70b in the first direction Z+.

The optical member 40 projects the light emitted from the light source unit 30.

As shown in FIG. 1, the holding member 20 holds the light source module 10. The holding member 20 includes, for example, the substrate 81 to which the multiple light source units are mounted, and holders 82a and 82b that are mounted to the substrate 81 and to which the multiple optical members 40 are mounted.

The components of the lighting device 1 will now be elaborated. An example will now be described in which the lighting device 1 is applied to, for example, a dental lighting device used to illuminate the interior of the oral cavity of a patient in a dental treatment. However, applications of the lighting device 1 are not limited to those described above.

The substrate 81 is, for example, a wiring substrate in which wiring of the first and second light-emitting elements 51 and 52 is located in a base material made of a resin material. The shape of the substrate 81 is a substantially rectangular plate shape in which a through-hole 81a is provided at substantially the center. However, the shape of the substrate 81 is not limited thereto.

The surfaces of the substrate 81 include a mounting surface 81b, and a back surface 81c positioned at the side opposite to the mounting surface 81b. The multiple light source units 30 are mounted to the mounting surface 81b of the substrate 81. A heat sink 90 is mounted to the back surface 81c.

For example, six light source units 30 are mounted to the mounting surface 81b of the substrate 81. The mounting surface 81b includes a first region 83a that has the X-direction as the longitudinal direction, and a second region 83b that is separated in the Y-direction from the first region 83a and has the X-direction as the longitudinal direction. The through-hole 81a is located between the first region 83a and the second region 83b. Three light source units 30 are arranged along the X-direction on the first region 83a. Another three light source units 30 are arranged along the X-direction on the second region 83b. However, the number and position of the light source units 30 included in the lighting device 1 are not limited to those described above.

As shown in FIG. 3, holes 81d, in which pins 61e of mounting portions 61a and 61b included in the rod lens 60 are disposed, are provided in the substrate 81. Also, through-holes 81e, through which fixtures 63 such as screws, rivets, etc., for fixing the mounting portions 61a and 61b to the substrate 81 are inserted, are provided in the substrate 81.

As shown in FIG. 1, the shape of the heat sink 90 is, for example, substantially the same as the shape of the substrate 81, and is, for example, a substantially rectangular plate shape in which a through-hole 90a is provided at substantially the center. For example, the heat sink 90 is made of a metal material such as copper, aluminum, stainless steel, or the like that has excellent heat dissipation. However, the shape of the heat sink 90 is not limited to that described above. Also, the lighting device 1 may not include the heat sink 90.

For example, when the lighting device 1 is applied to a dental lighting device, for example, a camera for imaging the interior of the oral cavity of the patient, etc., may be located in the through-hole 81a of the substrate 81 and the through-hole 90a of the heat sink 90.

Figure 4A:
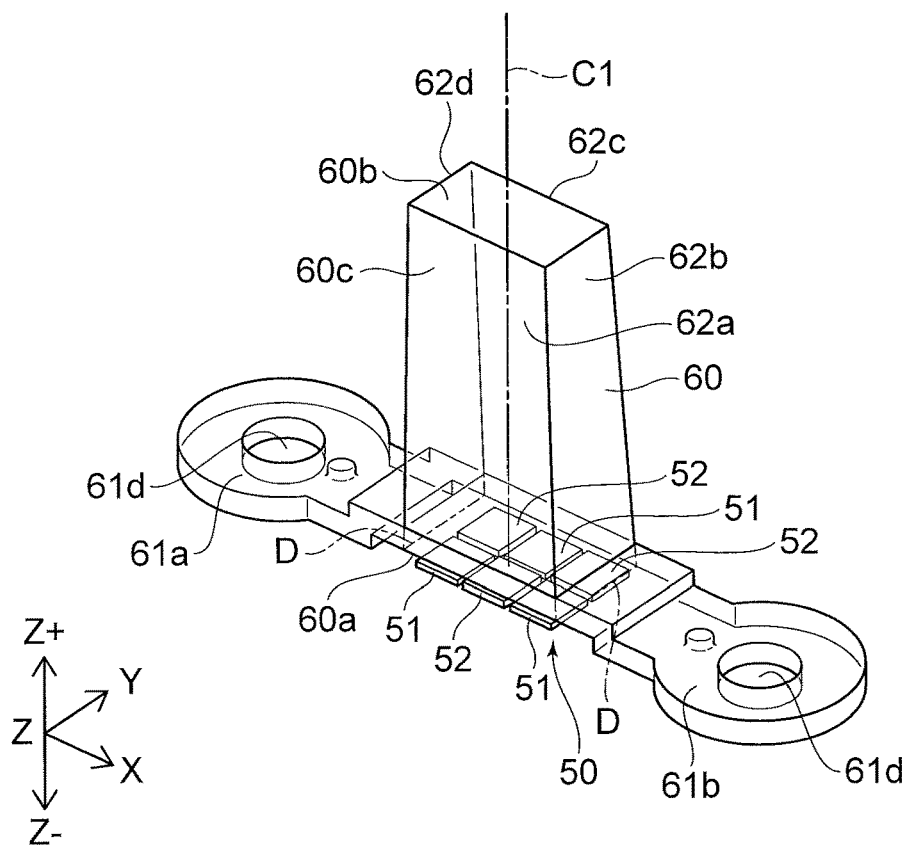
FIG. 4A is a perspective view showing a light source unit according to the first embodiment, and is a drawing showing a state before mounting a light-shielding body.

FIG. 4A is a perspective view showing a light source unit according to the embodiment, and is a drawing showing a state before mounting the light-shielding body.

Figure 4B:
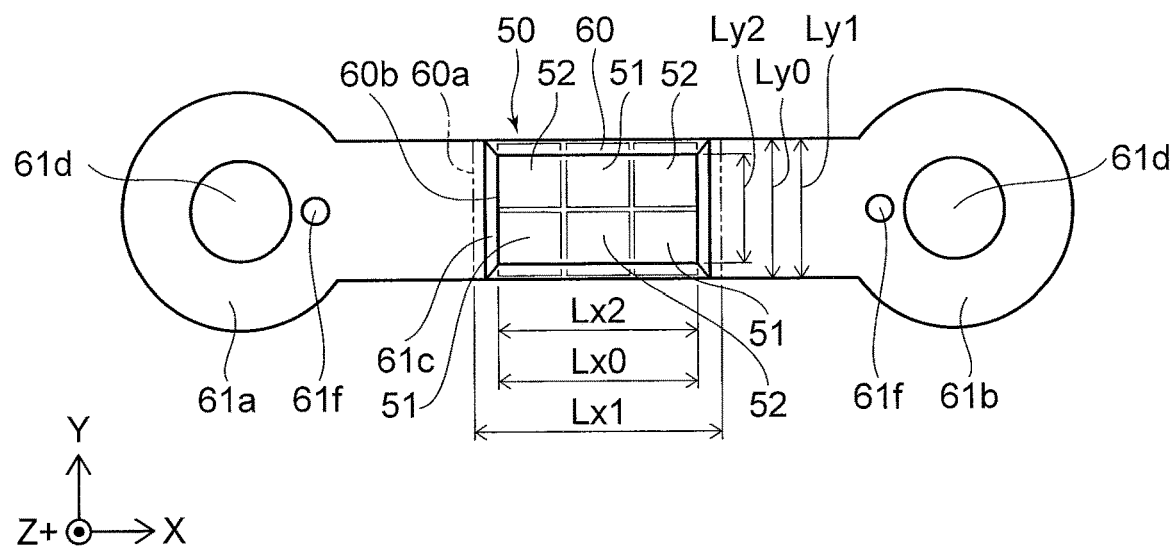
FIG. 4B is a top view showing the light source unit according to the first embodiment, and is a drawing showing the state before mounting the light-shielding body.

FIG. 4B is a top view showing the light source unit according to the embodiment, and is a drawing showing the state before mounting the light-shielding body.

As shown in FIG. 4A, each light source unit 30 includes the multiple first light-emitting elements 51, the multiple second light-emitting elements 52, and the rod lens 60.

The first light-emitting element 51 and the second light-emitting element 52 are, for example, LEDs (Light Emitting Diodes: light-emitting diodes). It is favorable for the color temperature of the light emitted from the first light-emitting element 51 and the color temperature of the light emitted from the second light-emitting element 52 to be different. The color temperature of the light emitted from the first light-emitting element 51 is, for example, not less than 2000 K and not more than 5000 K, e.g., 4500 K. The color temperature of the light emitted from the second light-emitting element 52 is, for example, not less than 4000 K and not more than 7000 K, e.g., 6500 K. However, the color temperature of the light emitted from the first light-emitting element 51 and the color temperature of the light emitted from the second light-emitting element 52 may be the same.

For example, the output of the first light-emitting element 51 and the output of the second light-emitting element 52 may be independently controllable. For example, in the lighting device 1, a state in which only the first light-emitting element 51 is lit, a state in which only the second light-emitting element 52 is lit, and a state in which both the first light-emitting element 51 and the second light-emitting element 52 are lit may be switchable. The output of the first light-emitting element 51 and the output of the second light-emitting element 52 may be independently controllable in the state in which both the first light-emitting element 51 and the second light-emitting element 52 are lit. Thereby, for example, when the lighting device 1 is applied to a dental lighting device, the dentist or the like can perform treatment such as whitening of the teeth, etc., while checking the appearance of the teeth of the patient in multiple environments such as daytime, dusk, etc., in which the states of the light are different.

As shown in FIG. 4A, for example, the number of the first light-emitting elements 51 and the number of the second light-emitting elements 52 are the same; according to the embodiment, for example, the case of three first light-emitting elements 51 and three second light-emitting elements 52 is shown. Hereinbelow, the multiple first light-emitting elements 51 and the multiple second light-emitting elements 52 of one light source unit 30 are called a "light-emitting element group 50". However, the number of the first light-emitting elements 51 and the number of the second light-emitting elements 52 in each light source unit 30 are not limited to those described above. For example, the number of the first light-emitting elements 51 and the number of the second light-emitting elements 52 may be different. Also, the number of the first light-emitting elements 51 and the number of the second light-emitting elements 52 in each light source unit 30 may be the same or may be different. Furthermore, each light source unit 30 may include light-emitting elements that have three or more mutually-different types of color temperatures of the emitted light.

As shown in FIGS. 4A and 4B, the shape of the first light-emitting element 51 and the shape of the second light-emitting element 52 are, for example, rectangular plate shapes. Each first light-emitting element 51 and each second light-emitting element 52 are mounted on the mounting surface 81b of the substrate 81.

For example, the three first light-emitting elements 51 and the three second light-emitting elements 52 are arranged to form a matrix of three rows in the X-direction and two columns in the Y-direction. It is favorable for the first light-emitting elements 51 and the second light-emitting elements 52 to be arranged to be dispersed. For example, each first light-emitting element 51 is next to the second light-emitting elements 52 in the X-direction and the Y-direction, and is not next to other first light-emitting elements 51 in the X-direction and the Y-direction. Each second light-emitting element 52 is next to the second light-emitting elements 52 in the X-direction and the Y-direction and is not next to other second light-emitting elements 52 in the X-direction and the Y-direction. However, the shapes and positions of the light-emitting elements 51 and 52 are not limited to those described above.

The rod lens 60 is made of a transmissive material. The shape of the rod lens 60 is, for example, a substantially truncated pyramid shape, e.g., a substantially quadrilateral truncated pyramid shape. For example, the rod lens 60 extends with an axis C1 as a central axis. For example, the axis C1 extends along the Z-direction. However, the axis C1 may be oblique to the Z-direction.

The rod lens 60 includes the first end surface 60a, the second end surface 60b, and the side surface 60c. The greater part of the light emitted from the first and second light-emitting elements 51 and 52 is incident on the first end surface 60a. The greater part of the light that is incident on the first end surface 60a repeats total internal reflections at the side surface 60c and propagates as an entirety in the first direction Z+. The light that propagates through the rod lens 60 and reaches the second end surface 60b is emitted out of the rod lens 60 from the second end surface 60b.

When the shape of the rod lens 60 is a quadrilateral truncated pyramid shape, the side surface 60c includes four surfaces 62a, 62b, 62c, and 62d as shown in FIG. 4A. For example, each of the surfaces 62a, 62b, 62c, and 62d approaches the axis C1 toward the first direction Z+. Each of the surfaces 62a, 62b, 62c, and 62d is, for example, a plane. However, each of the surfaces 62a, 62b, 62c, and 62d may not be a plane and may be, for example, a curved surface.

The first end surface 60a is the surface among the surfaces of the rod lens 60 that faces the first light-emitting element 51 and the second light-emitting element 52 in the first direction Z+ and is surrounded with the second direction Z− edges of the surfaces 62a and 62c and with the second direction Z− edges of the surfaces D of the surfaces 62b and 62d extended to the surface of the rod lens 60 that faces the light-emitting element group 50. The first end surface 60a is, for example, a substantially rectangular plane. The first end surface 60a is separated from the light-emitting element group 50 in the first direction Z+. For example, the first end surface 60a is orthogonal to the first direction Z+. As shown in FIG. 4B, the light-emitting element group 50 is positioned within the area of the first end surface 60a when viewed in top-view. In the example shown in FIG. 4B, for example, a maximum dimension Lx1 in the X-direction of the first end surface 60a is greater than a maximum dimension Lx0 in the X-direction of the light-emitting element group 50. Also, for example, it is favorable for a maximum dimension Ly1 in the Y-direction of the first end surface 60a to be substantially the same as a maximum dimension Ly0 in the Y-direction of the light-emitting element group 50, or for the maximum dimension Ly1 in the Y-direction of the first end surface 60a to be greater than the maximum dimension Ly0 in the Y-direction of the light-emitting element group 50.

The second end surface 60b is, for example, a substantially rectangular plane. The second end surface 60b is positioned at the side opposite to the first end surface 60a in the Z-direction. For example, the second end surface 60b is orthogonal to the first direction Z+. As shown in FIG. 4B, the surface area of the second end surface 60b is less than the surface area of the first end surface 60a. In the example shown in FIG. 4B, a maximum dimension Lx2 in the X-direction of the second end surface 60b is less than the maximum dimension Lx1 in the X-direction of the first end surface 60a. Also, a maximum dimension Ly2 in the Y-direction of the second end surface 60b is, for example, less than the maximum dimension Ly1 in the Y-direction of the first end surface 60a.

Thus, the surface area of the second end surface 60b is less than the surface area of the first end surface 60a. Thereby, the illumination region can be narrowed while causing the light emitted from the light-emitting element group 50 to be incident on the first end surface 60a. Therefore, for example, when the lighting device 1 is applied to a dental lighting device, for example, the illumination of the eyes of the patient, etc., can be suppressed while illuminating the teeth of the patient.

However, a portion of the light that is incident on the first end surface 60a has an incident angle on the side surface 60c that is less than the critical angle, and is emitted from the side surface 60c without undergoing total internal reflections at the side surface 60c. When the surface area of the second end surface 60b is less than the surface area of the first end surface 60a, compared to the case where the surface area of the second end surface 60b is equal to the surface area of the first end surface 60a, the side surface 60c is inclined to approach the axis C1 toward the first direction Z+; and the incident angle of the light on the side surface 60c is smaller. Therefore, the fraction of the light incident on the first end surface 60a that is emitted from the side surface 60c is higher. The light that is emitted from the side surface 60c reaches the light-shielding body 70 that is described below, and is absorbed.

When the light-shielding body 70 that is described below is not included, the light that is emitted from the side surface 60c is emitted in a direction that is further away from the axis C1 than the light emitted from the second end surface 60b, and becomes stray light that strays from the desired illumination region. According to the embodiment, the stray light can be suppressed because the light-shielding body 70 that is described below shields the light emitted from the side surface 60c. The illumination region can be precisely controlled thereby. Also, when stray light is irradiated in a region outside the desired illumination region, the contrast of the brightness between the desired illumination region and the region outside the desired illumination region decreases. The contrast between the desired illumination region and the region outside the desired illumination region can be increased by precise control of the illumination region by the light-shielding body 70 that is described below.

The mounting portions 61a and 61b that are mounted to the substrate 81 are included in the rod lens 60. The mounting portions 61a and 61b are made of transmissive materials. The mounting portions 61a and 61b and the rod lens 60 are formed to have a continuous body.

For example, the mounting portions 61a and 61b extend in the X-direction from the second direction Z− side end portion of the rod lens 60 and are mounted to the substrate 81. The second direction Z− end portions of the mounting portions 61a and 61b abut the mounting surface 81b.

Through-holes 61d through which the fixtures 63 are inserted are provided in the mounting portions 61a and 61b. Also, as shown in FIG. 3, the pins 61e that are disposed in the holes 81d of the substrate 81 are included in the mounting portions 61a and 61b. Also, pins 61f that are disposed in trenches 72d of the light-shielding body 70 that are described below are included in the mounting portions 61a and 61b.

Figure 5:
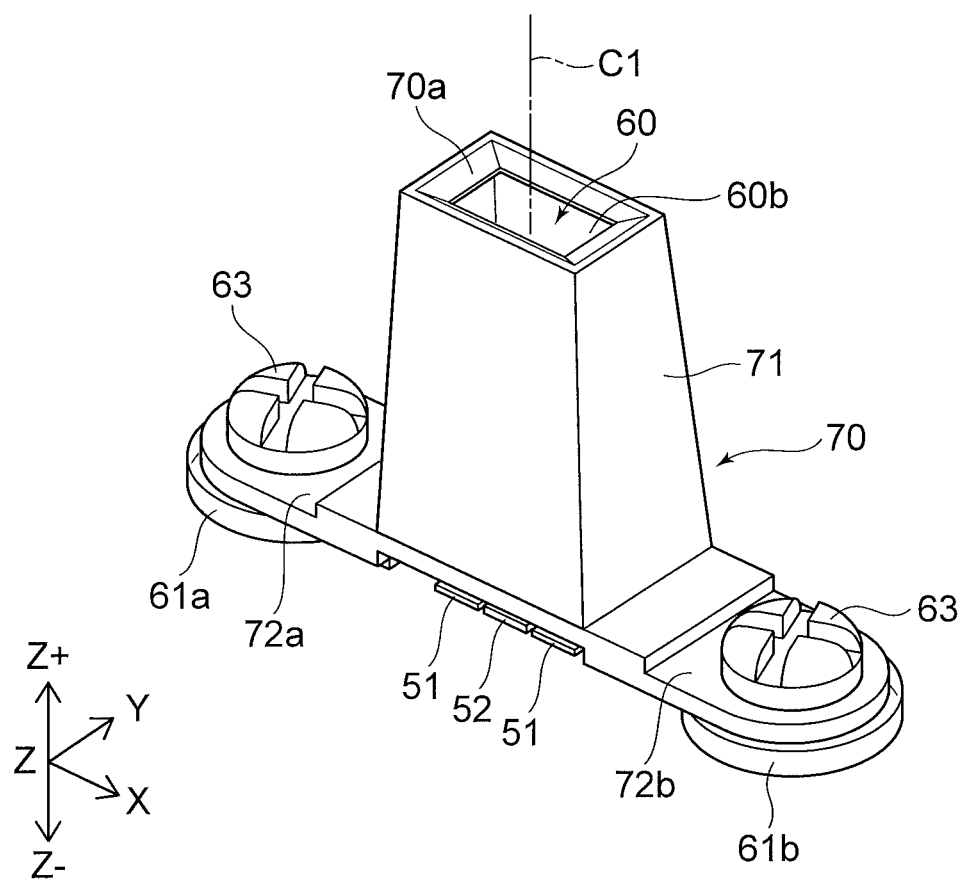
FIG. 5 is a perspective view showing the light source unit according to the first embodiment, and is a drawing showing a state in which the light-shielding body is mounted.

FIG. 5 is a perspective view showing the light source unit according to the embodiment, and is a drawing showing a state in which the light-shielding body is mounted.

Figure 6A:
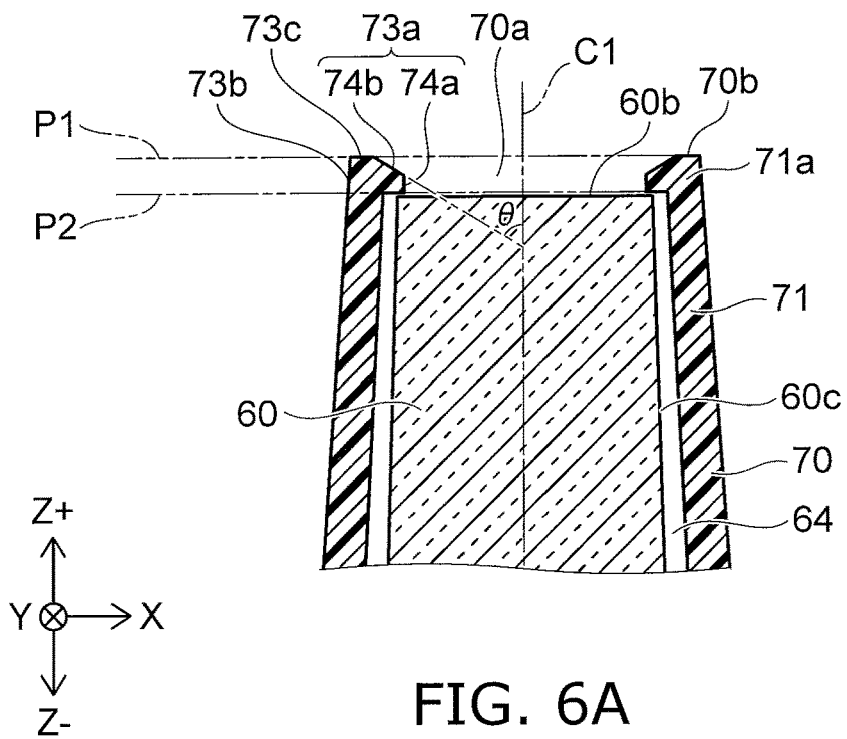
FIG. 6A is an end view showing a portion of the light source unit according to the first embodiment.

FIG. 6A is an end view showing a portion of the light source unit according to the embodiment.

Figure 6B:
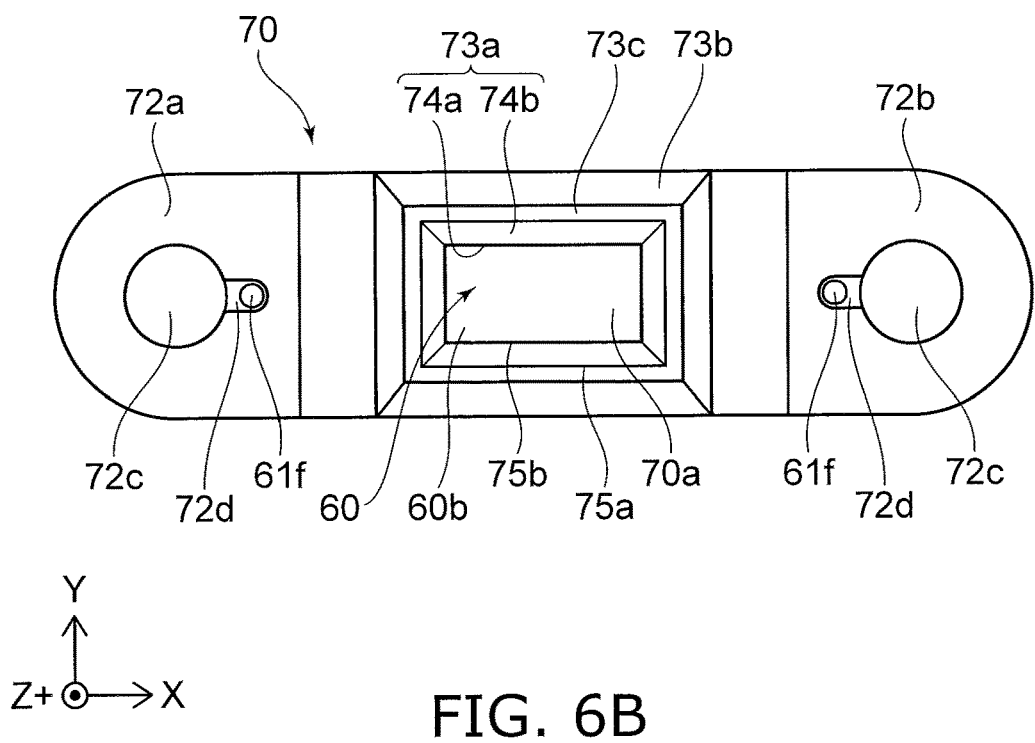
FIG. 6B is a top view showing the light source unit according to the first embodiment, and is a drawing showing the state in which the light-shielding body is mounted.

FIG. 6B is a top view showing the light source unit according to the embodiment, and is a drawing showing the state in which the light-shielding body is mounted.

As shown in FIG. 5, the light-shielding body 70 includes a main portion 71 that is separated from the side surface 60c of the rod lens 60 and covers the side surface 60c, and mounting portions 72a and 72b that extend in the X-direction from the second direction Z− side edge of the main portion 71 and are mounted to the substrate 81.

The shape of the main portion 71 is, for example, a shape that has a hollow substantially quadrilateral truncated pyramid shape. For example, the main portion 71 extends with the axis C1 as a central axis. As shown in FIG. 6A, for example, the main portion 71 covers the rim portion of the second end surface 60b and does not cover the central portion of the second end surface 60b. In other words, a constant portion of the main portion 71 from the tip 70b toward the second direction Z− protrudes further in the first direction Z+ than the second end surface 60b. Hereinbelow, the portion of the main portion 71 that protrudes further in the first direction Z+ than the second end surface 60b is called a protruding portion 71a.

The opening 70a that exposes the central portion of the second end surface 60b is provided in the protruding portion 71a. The protruding portion 71a is separated from the second end surface 60b. However, the protruding portion 71a may contact the second end surface 60b. The surfaces of the protruding portion 71a include a surface that faces the opening 70a (a portion 73a of the inner surface of the light-shielding body 70), a portion 73b of the outer surface of the light-shielding body 70, and a tip surface 73c.

The portion 73a of the inner surface includes, for example, a first region 74a that is substantially parallel to the axis C1, and a second region 74b that is positioned between the first region 74a and the tip surface 73c. As shown in FIG. 6B, the shape of the first region 74a is rectangular when viewed in top-view. As shown in FIG. 6A, the second region 74b separates from the axis C1 toward the first direction Z+. The second region 74b is, for example, a plane that is oblique to the first direction Z+ and to a direction orthogonal to the first direction Z+. An angle θ between the second region 74b and the first direction Z+ is, for example, not less than 45 degrees but less than 90 degrees, and favorably not less than 50 degrees and not more than 70 degrees. For example, the portion 73b of the outer surface approaches the axis C1 toward the first direction Z+. The portion 73b of the outer surface is a plane that is oblique to the first direction Z+. The tip surface 73c is located between the portion 73a of the inner surface and the portion 73b of the outer surface and contacts the portion 73a of the inner surface and the portion 73b of the outer surface. The tip surface 73c is, for example, a plane that is orthogonal to the first direction Z+.

As described above, the plane that is orthogonal to the first direction Z+ and is positioned at the same position as the tip 70b (the tip surface 73c) in the first direction Z+ is called the first plane P1. Also, the surface area of the opening 70a at the first plane P1 is called the "first surface area". Also, according to the embodiment, a second plane P2 at which the surface area of the opening 70a is less than the first surface area exists between the tip 70b and the second end surface 60b. According to the embodiment, the second plane P2 is, for example, a plane at which the surface area in the XY plane is a minimum, and is, for example, a plane that includes the second direction Z− side edge of the first region 74a. The surface area of the opening 70a at the second plane P2 is called the "second surface area".

The first surface area of the opening 70a at the first plane P1 is greater than the second surface area of the opening 70a at the second plane P2. As shown in FIG. 6B, an outer perimeter 75a of the opening 70a at the first plane P1 is positioned outward of an outer perimeter 75b of the opening 70a at the second plane P2 when viewed from the second direction Z−.

For example, through-holes 72c through which the fixtures 63 are inserted are provided in the mounting portions 72a and 72b. Also, the trenches 72d in which the pins 61f are disposed are provided in the mounting portions 72a and 72b. When mounting, as shown in FIG. 3, the rod lens 60 and the light-shielding body 70 are fixed to the substrate 81 by using the fixtures 63 in the state in which the pins 61e of the rod lens 60 are disposed in the holes 81d of the substrate 81, and the pins 61f are disposed in the trenches 72d of the light-shielding body 70. Thereby, the rod lens 60 can be aligned with respect to the substrate 81. Also, the light-shielding body 70 can be aligned with respect to the rod lens 60.

It is favorable for the inner surface of the main portion 71 of the light-shielding body 70 to be dark-colored, and more favorably black. For example, the light-shielding body 70 may be made of a resin material, and a black coating may be applied to the surface. Also, the light-shielding body 70 may be made of, for example, a light-absorbing material such as carbon black, etc. Thereby, the light-shielding body 70 can absorb the light emitted from the side surface 60c of the rod lens 60.

The light-shielding body 70 is separated from the side surface 60c of the rod lens 60; for example, an air layer 64 exists between the light-shielding body 70 and the side surface 60c of the rod lens 60. The refractive index of the rod lens 60 and the refractive index of the air layer 64 are much different; therefore, the critical angle at the side surface 60c is large, and the light that reaches the side surface 60c easily undergoes total internal reflections. Conversely, if the light-shielding body 70 contacts the rod lens 60, and the air layer 64 does not exist, then the critical angle at the side surface 60c is small, the light that reaches the side surface 60c is easily absorbed by the light-shielding body 70, and total internal reflections are difficult.

Figure 7A:
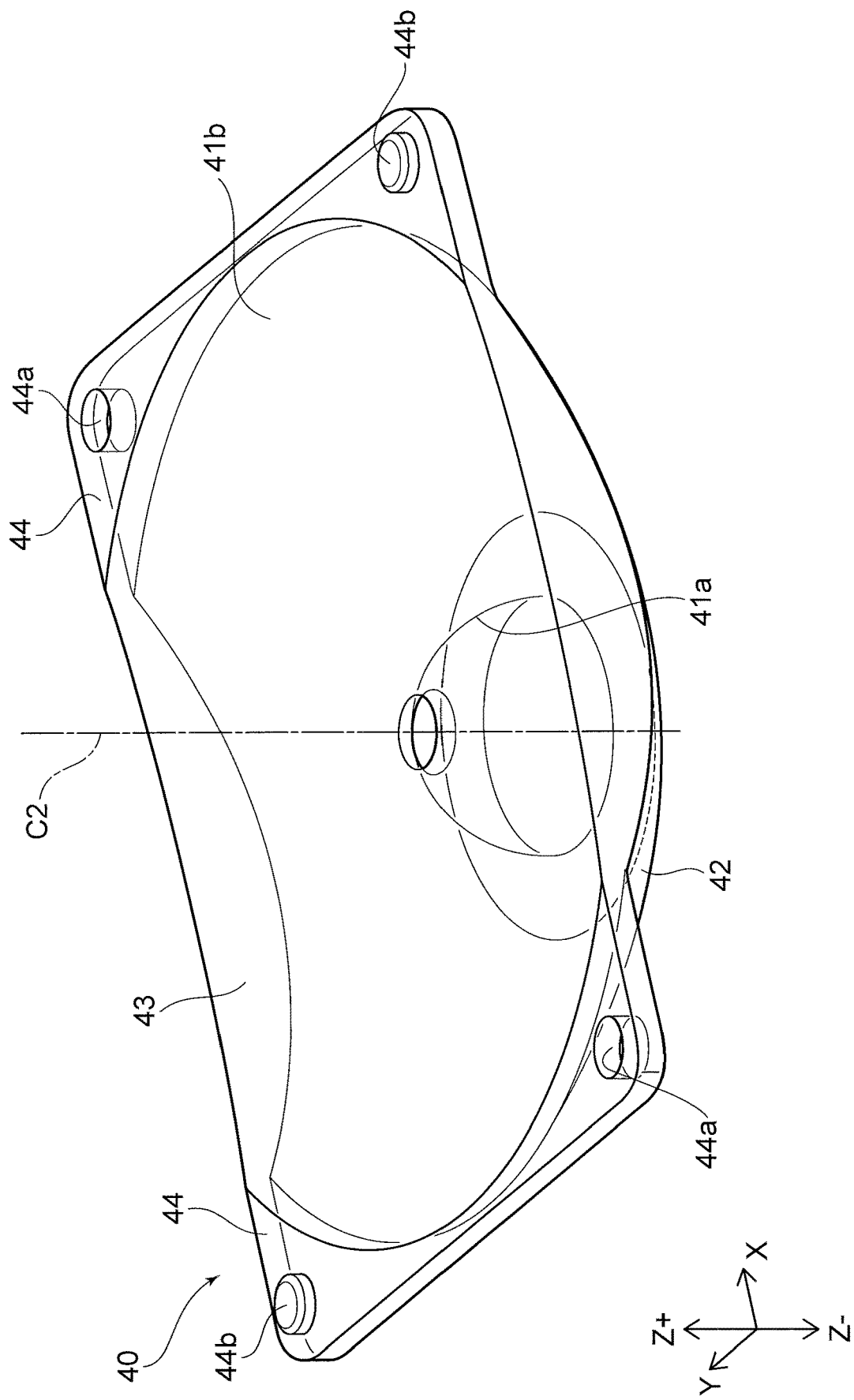
FIG. 7A is a perspective view showing an optical member.

FIG. 7A is a perspective view showing the optical member.

Figure 7B:
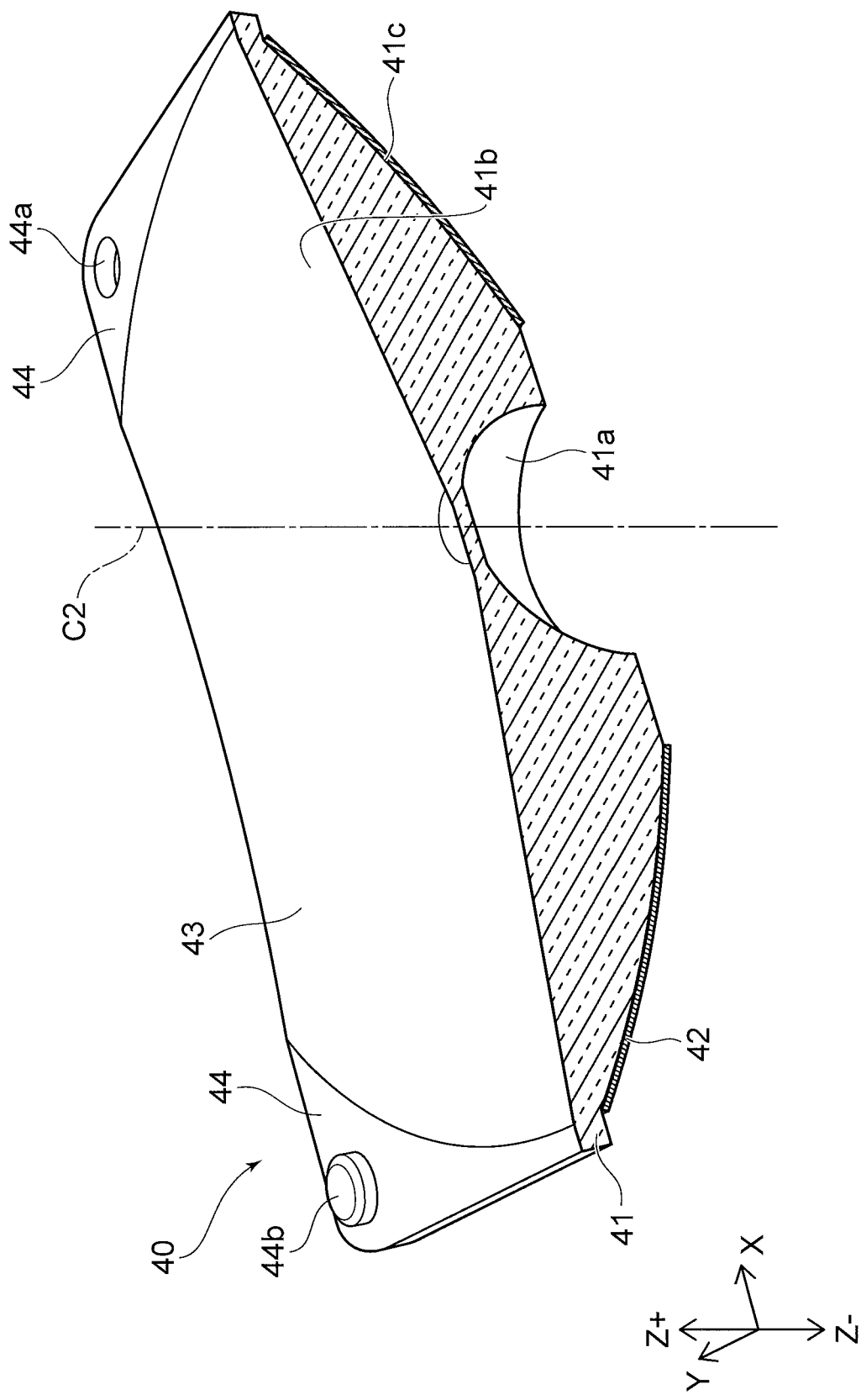
FIG. 7B is a cross-sectional perspective view showing the optical member.

FIG. 7B is a cross-sectional perspective view showing the optical member.

The optical member 40 includes, for example, a light-transmitting member 41 and a mirror layer 42.

The light-transmitting member 41 includes, for example, a main portion 43 and a flange portion 44. The main portion 43 extends with an axis C2 as a central axis. Hereinbelow, the side at which the light source unit 30 is located in the direction in which the axis C2 extends is called the "light incident side"; and the opposite side is called the "light-emitting side". The direction in which the axis C2 extends in the XYZ coordinate system of FIGS. 7A and 7B is an example; as described below, the direction in which the axis C2 extends is different in each light source unit 30.

The surfaces of the light-transmitting member 41 include a first surface 41a on which the light emitted from the light source unit 30 is incident, a second surface 41b that emits the incident light, and a third surface 41c positioned at the side opposite to the second surface 41b. The first surface 41a is located at the light incident side. For example, the first surface 41a has the axis C2 as a central axis and approaches the axis C2 toward the light-emitting side. The first surface 41a is a surface that is curved in a concave shape toward the light-emitting side. The first surface 41a faces the second end surface 60b of the rod lens 60. The second surface 41b is located further toward the light-emitting side than the first surface 41a. For example, the second surface 41b has the axis C2 as a central axis and approaches the axis C2 toward the light incident side. The second surface 41b is, for example, a surface that is concave toward the light incident side. The third surface 41c is located at the periphery of the first surface 41a. For example, the third surface 41c has the axis C2 as a central axis and approaches the axis C2 toward the light incident side. The third surface 41c is, for example, a surface that is curved in a convex shape toward the light incident side.

The flange portion 44 protrudes from the main portion 43 in a direction that crosses the axis C2. For example, through-holes 44a through which fixtures 86 such as screws, rivets, etc. (referring to FIG. 2) are inserted are provided in the flange portion 44. Also, pins 44b that are disposed in holes (not illustrated) provided in the holders 82a and 82b are included in the flange portion 44. Two through-holes 44a are located on one diagonal line that crosses the axis C2. Two pins 44b are located on another diagonal line that crosses the axis C2. When mounting, the optical members 40 are fixed to the holders 82a and 82b by the fixtures 86 in the state in which the pins 44b are disposed in the holes of the holders 82a and 82b. Thereby, the optical members 40 can be aligned with the holders 82a and 82b.

The mirror layer 42 is located at the third surface 41c. For example, the mirror layer 42 is made of a metal material having high light reflectance such as aluminum, silver, etc.

As shown in FIG. 1, for example, the holder 82a is located on the first region 83a of the substrate 81. For example, the holder 82b is located on the second region 83b of the substrate 81. For example, the holders 82a and 82b are made of resin materials. As shown in FIGS. 1 and 2, each of the holders 82a and 82b includes a mounting portion 84 to which the optical members 40 are mounted, and a supporter 85 that is mounted to the substrate 81 and supports the mounting portion 84. The supporter 85 extends in the first direction Z+ and is mounted to the substrate 81.

For example, three optical members 40 are mounted to the mounting portion 84. For example, the mounting portion 84 holds the optical members 40 so that the illumination regions of the light source modules 10 substantially match at a prescribed position separated from the lighting device 1 in the first direction Z+. The illumination region of each light source module 10 at the prescribed position in the first direction Z+ is, for example, a substantially rectangular region that has, as a center, an axis C3 (referring to FIG. 1) that extends in the first direction Z+ and passes through the center of the through-hole 81a of the substrate 81. Therefore, as shown in FIG. 2, the axis C2 of each optical member 40 is oblique to the axis C1 of the rod lens 60 to approach the axis C3 of the through-hole 81a at the prescribed position that is separated from the lighting device 1 in the first direction Z+.

Operations of the lighting device 1 according to the embodiment will now be described.

Figure 8:
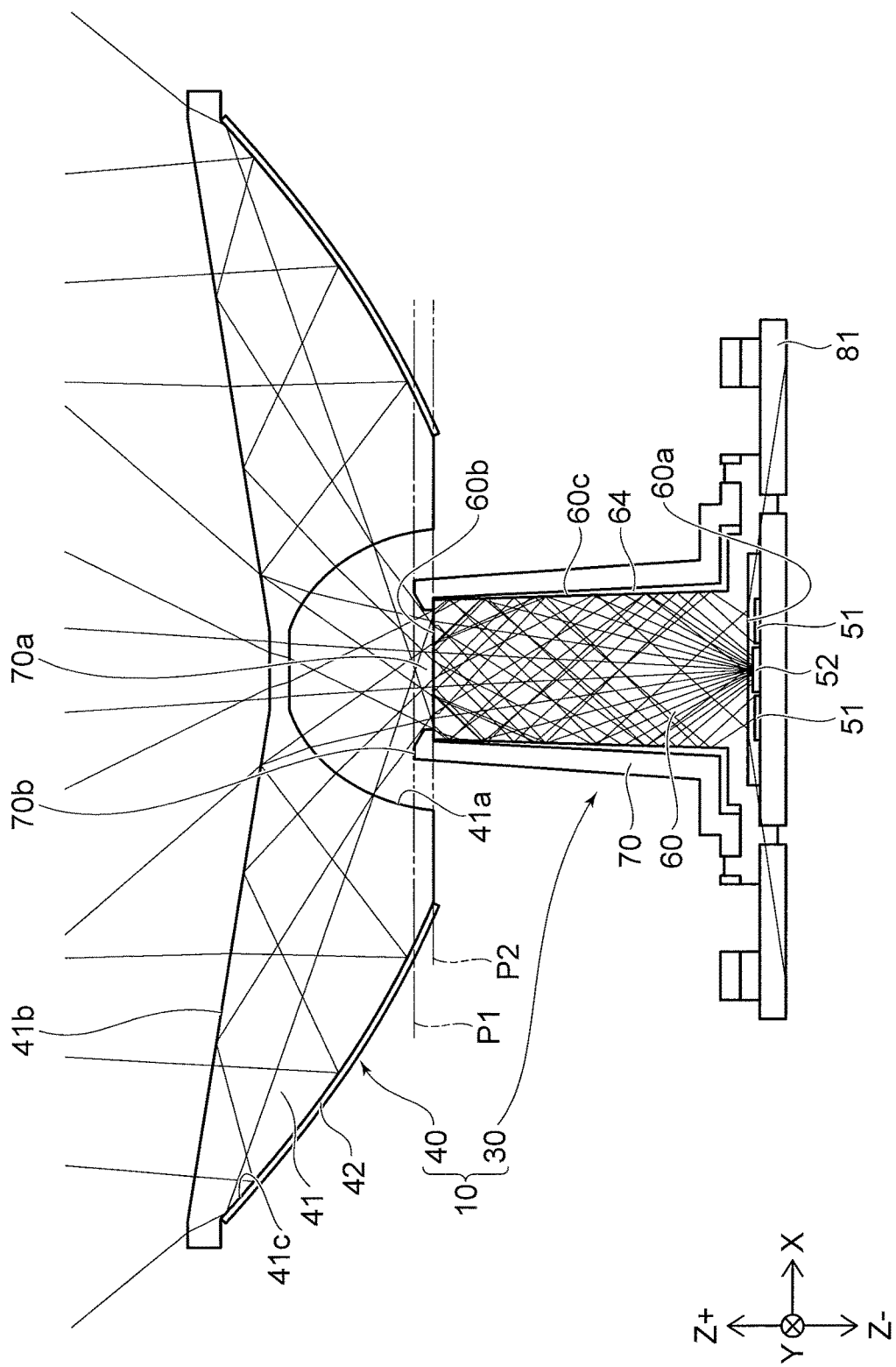
FIG. 8 is a drawing showing simulation results of a trajectory of light emitted from a first light-emitting element and a second light-emitting element at an end surface that includes an X-direction and a Z-direction.

FIG. 8 is a drawing showing simulation results of a trajectory of light emitted from the first and second light-emitting elements at an end surface that includes the X-direction and the Z-direction.

Figure 9A:
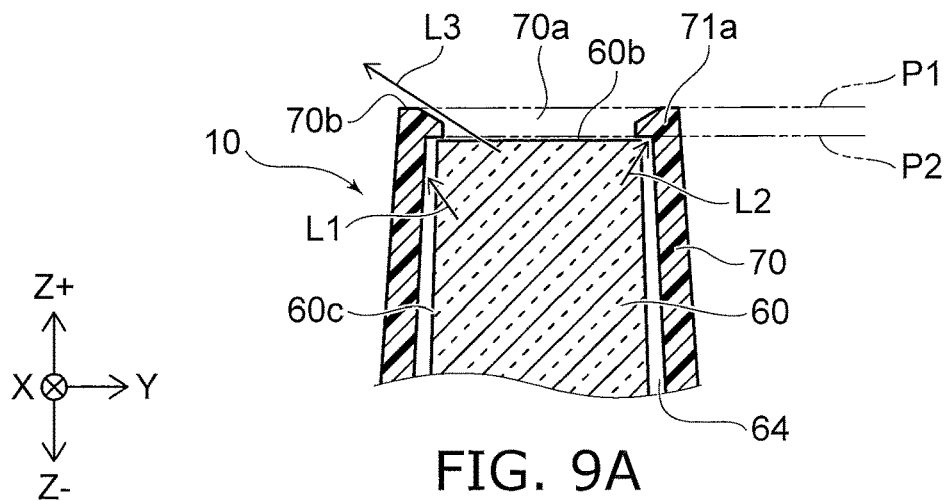
FIG. 9A is a schematic view showing light emitted from the rod lens of the light source unit according to the first embodiment.

FIG. 9A is a schematic view showing light emitted from the rod lens of the light source unit according to the embodiment.

Figure 9B:
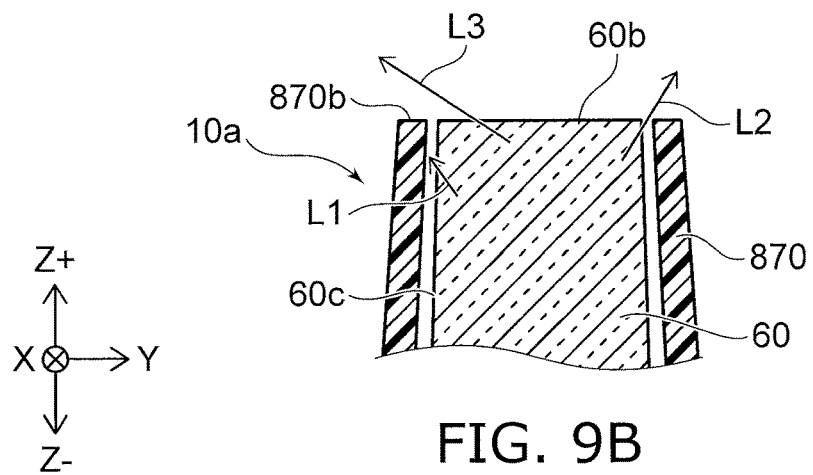
FIG. 9B is a schematic view showing light emitted from a rod lens of a light source unit according to a first reference example.

FIG. 9B is a schematic view showing light emitted from a rod lens of a light source unit according to a first reference example.

Figure 9C:
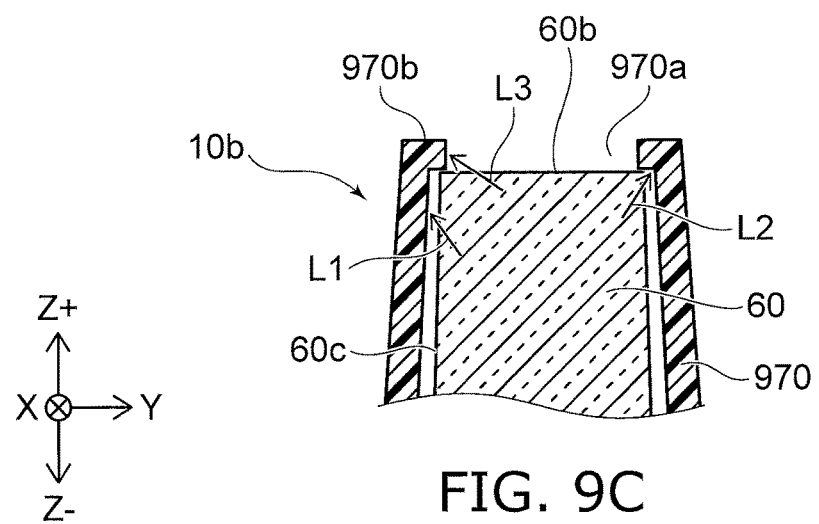
FIG. 9C is a schematic view showing light emitted from a rod lens of a light source unit according to a second reference example.

FIG. 9C is a schematic view showing light emitted from a rod lens of a light source unit according to a second reference example.

As shown in FIG. 8, the greater part of the light emitted from the first and second light-emitting elements 51 and 52 enters the rod lens 60 from the first end surface 60a. The greater part of the light that enters the rod lens 60 repeats total internal reflections at the side surface 60c and propagates as an entirety in the first direction Z+. The light that propagates through the rod lens 60 and reaches the second end surface 60b is emitted out of the rod lens 60 from the second end surface 60b.

As shown by arrow L1 in FIG. 9A, a portion of the light that is incident on the first end surface 60a has an incident angle at the side surface 60c that is less than the critical angle and is emitted from the side surface 60c without undergoing total internal reflections at the side surface 60c. When the surface area of the second end surface 60b is less than the surface area of the first end surface 60a, the incident angle of the light at the side surface 60c easily becomes small, and the light that is emitted from the side surface 60c increases. According to the embodiment, the light-shielding body 70 absorbs the light emitted from the side surface 60c of the rod lens 60.

When the light-shielding body 70 is not included, the light that is emitted from the side surface 60c of the rod lens 60 is emitted in a direction that is further away from the axis C1 than the light emitted from the second end surface 60b, and becomes stray light that strays from the desired illumination region. According to the embodiment, the stray light can be suppressed because the light-shielding body 70 shields the light emitted from the side surface 60c. The illumination region can be precisely controlled thereby. Also, when the stray light is irradiated in a region outside the desired illumination region, the contrast between the desired illumination region and the region outside the desired illumination region decreases. The contrast between the desired illumination region and the region outside the desired illumination region can be increased by the light-shielding body 70 precisely controlling the illumination region.

The air layer 64 exists between the light-shielding body 70 and the side surface 60c of the rod lens 60. The refractive index of the rod lens 60 and the refractive index of the air layer 64 are much different; therefore, the critical angle at the side surface 60c is large, and the light that reaches the side surface 60c easily undergoes total internal reflections. Conversely, if the light-shielding body 70 contacts the rod lens 60, and the air layer 64 does not exist, then the critical angle at the side surface 60c is small, the light that reaches the side surface 60c is easily absorbed by the light-shielding body 70, and total internal reflections are difficult.

Furthermore, as shown by arrow L2, there are cases where light is emitted from a region of the side surface 60c at the vicinity of the second end surface 60b. According to the embodiment, the light-shielding body 70 includes the protruding portion 71a that protrudes further in the first direction Z+ than the second end surface 60b of the rod lens 60. Therefore, even the light that is emitted from the region of the side surface 60c at the vicinity of the second end surface 60b can be absorbed by the light-shielding body 70.

Furthermore, the first surface area of the opening 70a at the first plane P1 is greater than the second surface area of the opening 70a at the second plane P2. As shown by arrow L3, the shielding by the protruding portion 71a of the light emitted in a direction crossing in the first direction Z+ from the region of the second end surface 60b at the vicinity of the side surface 60c can be suppressed thereby. Thus, according to the embodiment, sufficient light can be irradiated on the illumination region by transmitting the light shown by arrow L3 while suppressing the stray light by absorbing the light shown by arrows L1 and L2.

In a light source unit 10a according to the first reference example shown in FIG. 9B, a tip 870b of a light-shielding body 870 is positioned at the same position as the second end surface 60b in the first direction Z+. In such a case as shown by arrow L1, the light-shielding body 870 can shield the light emitted from the region of the side surface 60c that is separated from the second end surface 60b. Also, as shown by arrow L3, the light-shielding body 870 does not shield the light emitted from the second end surface 60b in the direction crossing the first direction Z+. However, as shown by arrow L2, the light that is emitted from the region of the side surface 60c at the vicinity of the second end surface 60b is unshielded. Therefore, there are cases where the light that is emitted from the region of the side surface 60c at the vicinity of the second end surface 60b becomes stray light that strays from the desired illumination region. Accordingly, compared to the light source unit 10a according to the first reference example, the light source unit 30 according to the embodiment can suppress the stray light.

In a light source unit 10b according to the second reference example shown in FIG. 9C, a tip 970b of a light-shielding body 970 protrudes further than the second end surface 60b in the first direction Z+, but the surface area is constant at each XY plane of an opening 970a at each position in the first direction Z+. In such a case, as shown by arrow L1, the light-shielding body 970 can shield the light emitted from the region of the side surface 60c that is separated from the second end surface 60b. Also, as shown by arrow L2, the light-shielding body 970 can shield the light emitted from the region of the side surface 60c at the vicinity of the second end surface 60b. However, as shown by arrow L3, the light-shielding body 970 also shields the light emitted from the second end surface 60b in the direction crossing the first direction Z+. Accordingly, compared to the light source unit 10b according to the second reference example, the light extraction efficiency of the light source unit 30 according to the embodiment is high.

As shown in FIG. 8, the greater part of the light emitted from the second end surface 60b is incident on the first surface 41a of the optical member 40. A portion of the light that is incident on the first surface 41a undergoes total internal reflections at the second surface 41b. The light that undergoes total internal reflections at the second surface 41b is reflected by the mirror layer 42. The light that is reflected by the mirror layer 42 is emitted from the second surface 41b. Thus, the travel direction of the light emitted from the light source unit 30 is bent by being reflected mainly two times by the optical member 40. As a result, the occurrence of chromatic aberration can be suppressed compared to the case where the travel direction of the light is bent by refraction by using a convex lens.

Figure 10A:
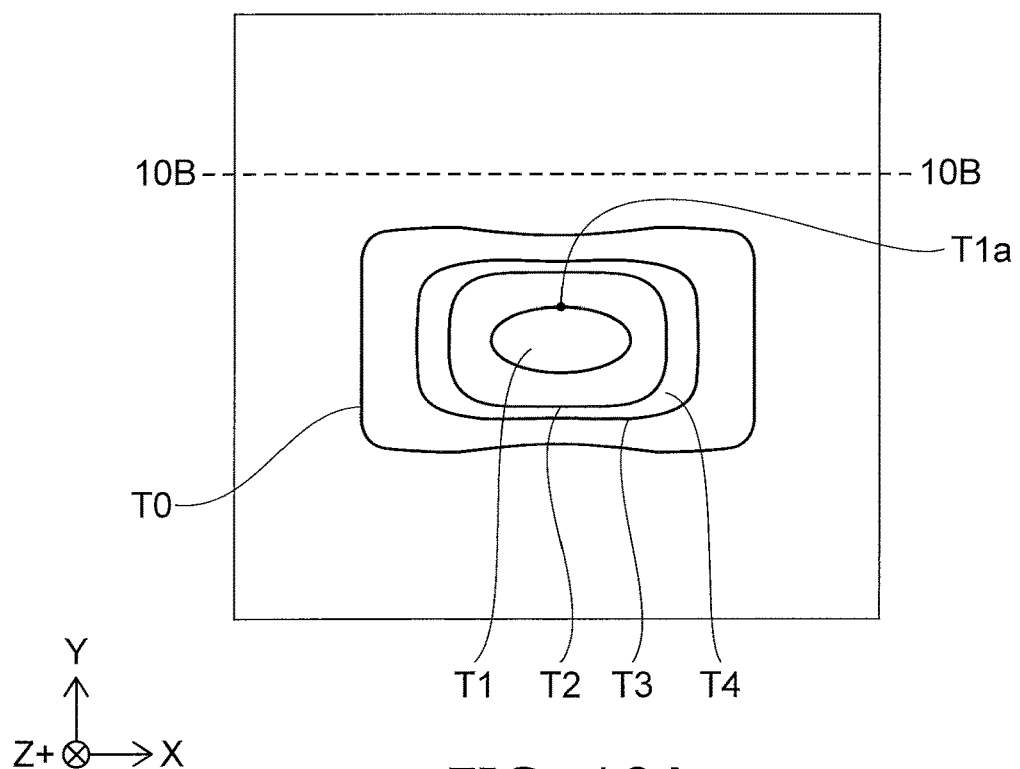
FIG. 10A is a drawing illustrating an illumination pattern of the lighting device according to the first embodiment.

FIG. 10A is a drawing illustrating an illumination pattern of the lighting device according to the embodiment.

Figure 10B:
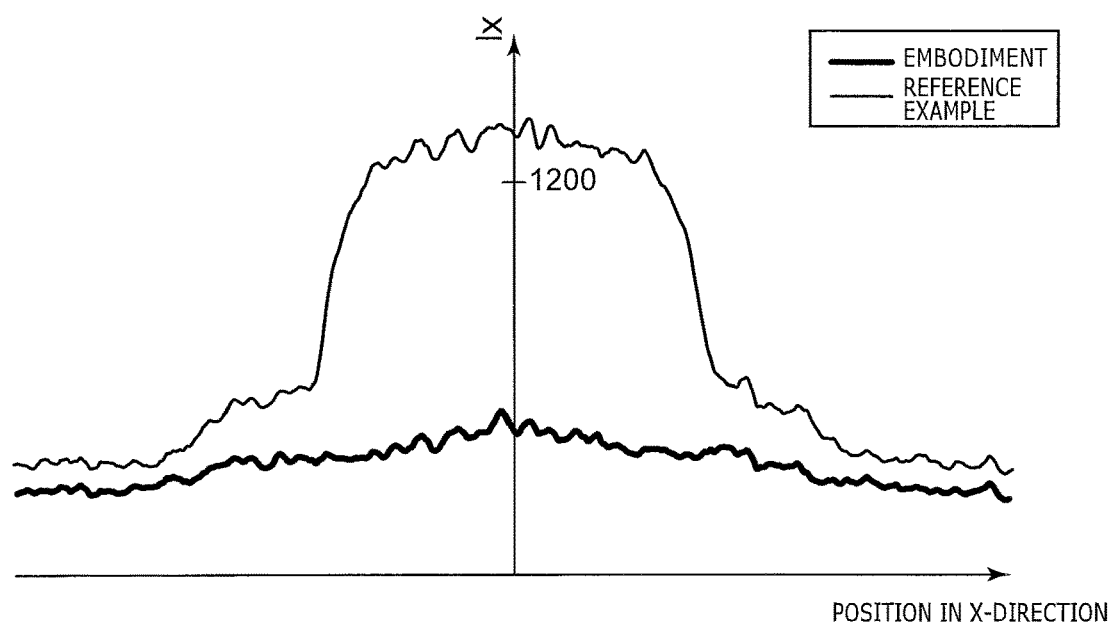
FIG. 10B is a graph showing simulation results of an illuminance distribution along line 10B-10B of FIG. 10A, wherein the vertical axis is the illuminance, and the horizontal axis is the position in the X-direction.

FIG. 10B is a graph showing simulation results of illuminance distributions along line 10B-10B of FIG. 10A, in which the vertical axis is the illuminance, and the horizontal axis is the position in the X-direction.

JIS T 5753:2017 defines requirements for dental lighting devices used to illuminate the interior of the oral cavity of a patient in dental treatment, etc. According to JIS T 5753:2017, the region inside an ellipse that has a horizontal axis of 50 mm (according to the embodiment, the major axis along the X-direction) and a vertical axis of 25 mm (according to the embodiment, the minor axis along the Y-direction) and includes the point of maximum illuminance inside an illumination region T0 of the dental lighting device at a position of the illumination region of 700 mm is defined as an "A-region T1". The A-region T1 is required to be within the area of an equiluminous line T2 at 75% of the maximum illuminance. Also, a region between the A-region T1 and an equiluminous line T3 at 50% of the maximum illuminance is defined as a "B-region T4". The contour of the B-region T4 is required to be positioned on or outward of an ellipse having a horizontal axis of 80 mm and a vertical axis of 40 mm. Also, it is required that the illuminance is not more than 1200 lx at any point on a horizontal line (according to the embodiment, along line 10B-10B) positioned 60 mm above (according to the embodiment, in the Y-direction from) an upper edge T1a of the A-region T1 in the minor-axis direction. This is to suppress the irradiation of light on the eyes of the patient while irradiating the light into the oral cavity of the patient.

FIG. 10A shows the A-region T1, the equiluminous line T2 at 75% of the maximum illuminance, the equiluminous line T3 at 50% of the maximum illuminance, and the B-region T4 in the illumination region TO of the lighting device 1. Thus, in the illumination region TO of the lighting device 1, the A-region T1 is not less than 75% of the maximum illuminance. Also, the contour of the B-region T4 is positioned outward of an ellipse having a horizontal axis of 80 mm and a vertical axis of 40 mm.

In the lighting device 1 according to the embodiment as shown in FIG. 10B, the illuminance at any point on a horizontal line (in FIG. 10A, along line 10B-10B) positioned 60 mm above the upper edge T1a of the A-region T1 is less than 1200 lx. On the other hand, in a lighting device according to a reference example that does not include the light-shielding body 70, the illuminance at a portion of points on a horizontal line positioned 60 mm above the upper edge T1a of the A-region T1 is greater than 1200 lx. This is because the stray light is suppressed by the light-shielding body 70 in the lighting device 1 according to the embodiment, but the stray light is not suppressed in the lighting device according to the reference example. As described above, the lighting device 1 according to the embodiment satisfies the JIS T 5753:2017 standard, but the lighting device according to the reference example does not satisfy the JIS T 5753:2017 standard.

Effects of the embodiment will now be described.

According to the embodiment, the surface area of the second end surface 60b of the rod lens 60 is less than the surface area of the first end surface 60a. The illumination region can be narrowed thereby, while causing the light emitted from the first and second light-emitting elements 51 and 52 to be incident on the first end surface 60a.

Also, the surface area of the second end surface 60b is less than the surface area of the first end surface 60a; therefore, compared to the case where the surface area of the second end surface 60b is equal to the surface area of the first end surface 60a, the side surface 60c is inclined to approach the axis C1 toward the light-emitting side in the first direction Z+, and the incident angle of the light with respect to the side surface 60c is small. Therefore, the fraction of the light incident on the first end surface 60a that is emitted from the side surface 60c is high. In the light source unit 30 according to the embodiment, the light-shielding body 70 covers the side surface 60c of the rod lens 60. Also, the tip 70b of the light-shielding body 70 protrudes further in the first direction Z+ than the second end surface 60b. In other words, the light-shielding body 70 includes the protruding portion 71a. Thereby, the light-shielding body 70 can shield the greater part of the light emitted from the side surface 60c; and the stray light can be suppressed. Furthermore, according to the embodiment, the occurrence of the stray light is suppressed by the light-shielding body 70; thereby, compared to the case where the light-shielding body 70 is not included, the contrast between the desired illumination region and the region outside the desired illumination region can be increased.

Furthermore, according to the embodiment, the first surface area of the opening 70a at the first plane P1 positioned at the same position as the tip 70b in the first direction Z+ is greater than the second surface area of the opening 70a at the second plane P2 positioned between the tip 70b and the second end surface 60b in the first direction Z+. The shielding by the protruding portion 71a of the light emitted from the second end surface 60b can be suppressed thereby, while the stray light is suppressed by the protruding portion 71a. The light extraction efficiency can be increased thereby.

Thus, according to the embodiment, the light source unit 30, the light source module 10, and the lighting device 1 can be provided in which the illumination region can be precisely controlled while realizing the desired illuminance.

Also, according to the embodiment, the light-shielding body 70 covers the rim portion of the second end surface 60b. Thereby, the stray light can be more reliably suppressed because the light-shielding body 70 covers the gap between the light-shielding body 70 and the side surface 60c of the rod lens 60.

Also, according to the embodiment, the region (the second region 74b) of the surface of the light-shielding body 70 (the portion 73a of the inner surface of the light-shielding body 70) facing the opening 70a between the first plane P1 and the second plane P2 is oblique to the first direction Z+. Thereby, the shielding by the light-shielding body 70 of the light emitted from the second end surface 60b in a direction crossing the first direction Z+ can be suppressed while suppressing the stray light.

Also, according to the embodiment, the outer perimeter 75a of the opening 70a at the first plane P1 is positioned outward of the outer perimeter 75b of the opening 70a at the second plane P2 when viewed from the second direction Z−. Thereby, the shielding by the light-shielding body 70 of the light emitted from the second end surface 60b in various directions crossing the first direction Z+ can be suppressed while suppressing the stray light.

Also, according to the embodiment, the outer perimeter of the second end surface 60b of the rod lens 60 is positioned inward of the outer perimeter of the first end surface 60a of the rod lens 60 when viewed from the second direction Z−. Thereby, the illumination region can be narrowed while causing the light emitted from the first and second light-emitting elements 51 and 52 to be incident on the first end surface 60a.

Also, the color temperature of the light emitted from the first light-emitting element 51 is different from the color temperature of the light emitted from the second light-emitting element 52. Therefore, the color tone of the light emitted from the second end surface 60b can be changed by adjusting the output of the first light-emitting element 51 and the output of the second light-emitting element 52.

Also, the light source module 10 according to the embodiment includes the light source unit 30 and the optical member 40. The optical member 40 includes the light-transmitting member 41 that includes the first surface 41a on which the light emitted from the light source unit 30 is incident, the second surface 41b that emits the light, and the third surface 41c positioned at the side opposite to the second surface 41b, and includes the mirror layer 42 located at the third surface 41c of the light-transmitting member 41. Thereby, the travel direction of the light emitted from the light source unit 30 is bent mainly by reflections using the optical member 40. As a result, compared to the case where the travel direction of the light is bent by refraction using a convex lens, the occurrence of chromatic aberration can be suppressed.

Also, the lighting device 1 according to the embodiment is, for example, a dental lighting device. In a dental lighting device, it is favorable for the light to be irradiated into the oral cavity of the patient but not to be irradiated toward the eyes, etc. By applying the lighting device 1 that includes the light source unit to a dental lighting device, the light can be irradiated on the oral cavity of the patient without irradiating the light toward the eyes, etc.

First Modification of First Embodiment

A first modification of the first embodiment will now be described.

Figure 11A:
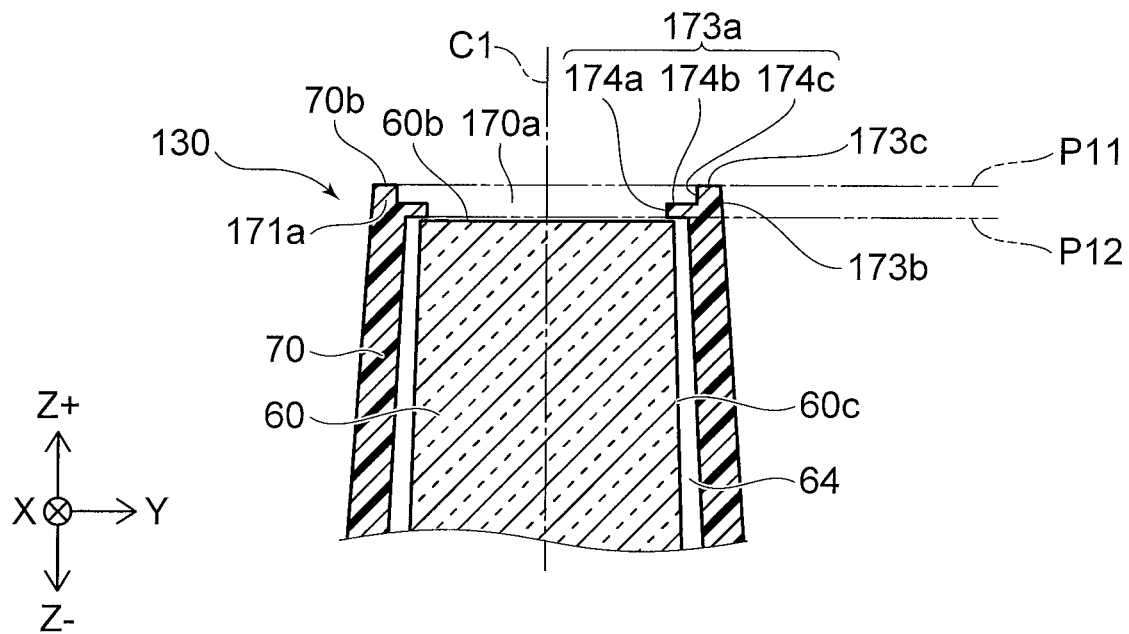
FIG. 11A is an end view showing a portion of a light source unit according to a first modification of the first embodiment.

FIG. 11A is an end view showing a portion of a light source unit according to the modification.

The shape of a protruding portion 171a of the light-shielding body 70 of the light source unit 130 according to the modification is different from the shape of the protruding portion 71a according to the first embodiment.

As a general rule in the following description, only the differences with the first embodiment are described. Other than the items described below, the modification is similar to the first embodiment. This is similar for the other modifications and embodiments described below as well.

An opening 170a that exposes the central portion of the second end surface 60b is provided in the protruding portion 171a of the light-shielding body 70. The surfaces of the protruding portion 171a include a surface (a portion 173a of the inner surface of the light-shielding body 70) facing the opening 170a, a portion 173b of the outer surface of the light-shielding body 70, and a tip surface 173c.

A step is provided in the portion 173a of the inner surface. For example, the portion 173a of the inner surface includes a first region 174a that is substantially parallel to the first direction Z+, a second region 174b that crosses the first direction Z+ and contacts the first direction Z+ side edge of the first region 174a, and a third region 174c that is substantially parallel to the first direction Z+ and contacts the first direction Z+ side edge of the second region 174b. For example, the portion 173b of the outer surface is inclined to approach the axis C1 toward the first direction Z+. The tip surface 173c is located between the portion 173a of the inner surface and the portion 173b of the outer surface and contacts the portion 173a of the inner surface and the portion 173b of the outer surface. The tip surface 173c is, for example, a plane that is orthogonal to the first direction Z+.

Hereinbelow, a plane that is orthogonal to the first direction Z+ and is positioned at the same position as the tip 70b (the tip surface 173c) in the first direction Z+ is called a first plane P11. Also, the surface area of the opening 170a at the first plane P11 is called the "first surface area". Also, a second plane P12 at which the surface area of the opening 170a is less than the first surface area exists between the tip 70b and the second end surface 60b. According to the modification, the second plane P12 is, for example, a plane at which the surface area of the XY plane is a minimum and is, for example, a plane that includes the second direction Z− side edge of the first region 174a. The surface area of the opening 170a at the second plane P12 is called the "second surface area".

The first surface area of the opening 170a at the first plane P11 is greater than the second surface area of the opening 170a at the second plane P12. The outer perimeter of the opening 170a at the first plane P11 is positioned outward of the outer perimeter of the opening 170a at the second plane P12 when viewed from the second direction Z−. As described above, a step is provided in the portion 173a of the inner surface positioned between the first plane P11 and the second plane P12. The step may include two or more steps.

Effects of the modification will now be described.

According to the modification, a step is provided in a region (the portion 173a of the inner surface of the light-shielding body 70) of the surface of the light-shielding body 70 facing the opening 170a between the first plane P11 and the second plane P12. Thereby, the shielding by the light-shielding body 70 of the light emitted from the second end surface 60b in directions crossing the first direction Z+ can be suppressed while suppressing the stray light.

Second Modification of First Embodiment

A second modification of the first embodiment will now be described.

Figure 11B:
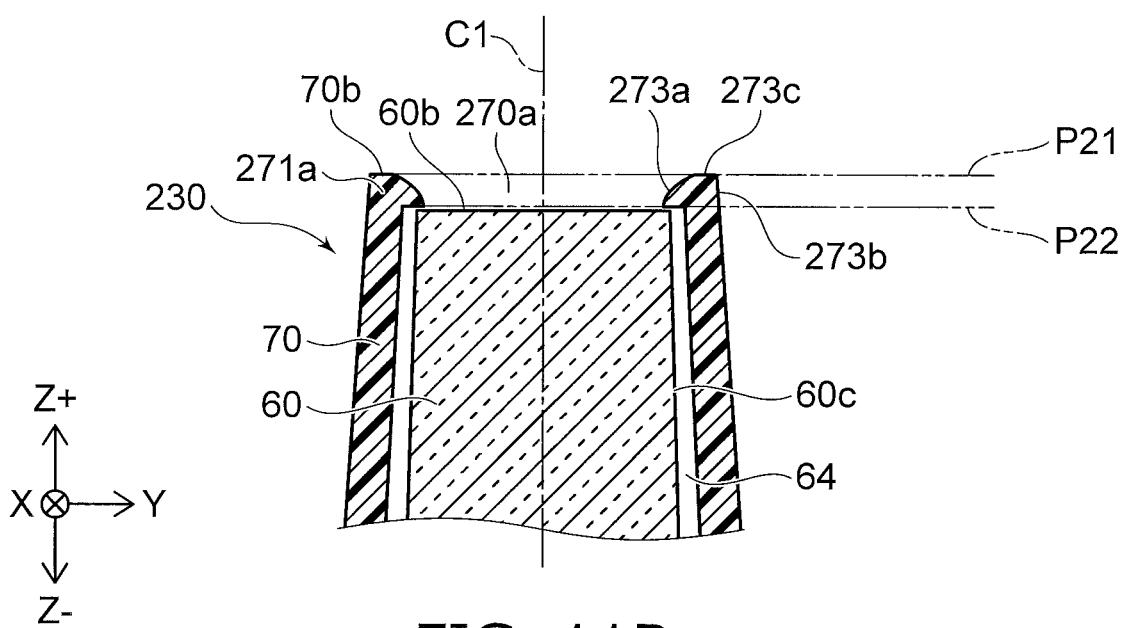
FIG. 11B is an end view showing a portion of a light source unit according to a second modification of the first embodiment.

FIG. 11B is an end view showing a portion of a light source unit according to the modification.

The shape of a protruding portion 271a of the light-shielding body 70 of the light source unit 230 according to the modification is different from the shape of the protruding portion 71a according to the first embodiment.

An opening 270a that exposes the central portion of the second end surface 60b is provided in the protruding portion 271a of the light-shielding body 70. The surfaces of the protruding portion 271a include a surface (a portion 273a of the inner surface of the light-shielding body 70) facing the opening 270a, a portion 273b of the outer surface of the light-shielding body 70, and a tip surface 273c.

The portion 273a of the inner surface separates from the axis C1 toward the first direction Z+. The portion 273a of the inner surface is curved in a convex shape toward the first direction Z+. However, the portion 273a of the inner surface may be curved in a concave shape toward the second direction Z−. For example, the portion 273b of the outer surface is inclined to approach the axis C1 toward the first direction Z+. For example, the portion 273b of the outer surface is inclined to approach the axis C1 toward the first direction Z+. The tip surface 273c is located between the portion 273a of the inner surface and the portion 273b of the outer surface and contacts the portion 273a of the inner surface and the portion 273b of the outer surface. The tip surface 273c is, for example, a plane that is orthogonal to the first direction Z+.

Hereinbelow, a plane that is orthogonal to the first direction Z+ and is positioned at the same position as the tip 70b in the first direction Z+ is called a first plane P21. Also, the surface area of the opening 270a at the first plane P21 is called the "first surface area". Also, a second plane P22 at which the surface area of the opening 270a is less than the first surface area exists between the tip 70b and the second end surface 60b. According to the modification, the second plane P22 is, for example, a plane at which the surface area of the XY plane is a minimum and is, for example, a plane that includes the second direction Z– side edge of the portion 273a of the inner surface. The surface area of the opening 270a at the second plane P22 is called the "second surface area".

The first surface area of the opening 270a at the first plane P21 is greater than the second surface area of the opening 270a at the second plane P22. The outer perimeter of the opening 270a at the first plane P21 is positioned outward of the outer perimeter of the opening 270a at the second plane P22 when viewed from the second direction Z–. As described above, the portion 273a of the inner surface that is positioned between the first plane P21 and the second plane P22 is curved.

Effects of the modification will now be described.

According to the modification, the region of the surface of the light-shielding body 70 (the portion 273a of the inner surface of the light-shielding body 70) facing the opening 270a between the first plane P21 and the second plane P22 is curved. Thereby, the shielding by the light-shielding body 70 of the light emitted from the second end surface 60b in directions oblique to the first direction Z+ can be suppressed while suppressing the stray light.

<Second Embodiment>

A second embodiment will now be described.

Figure 12:
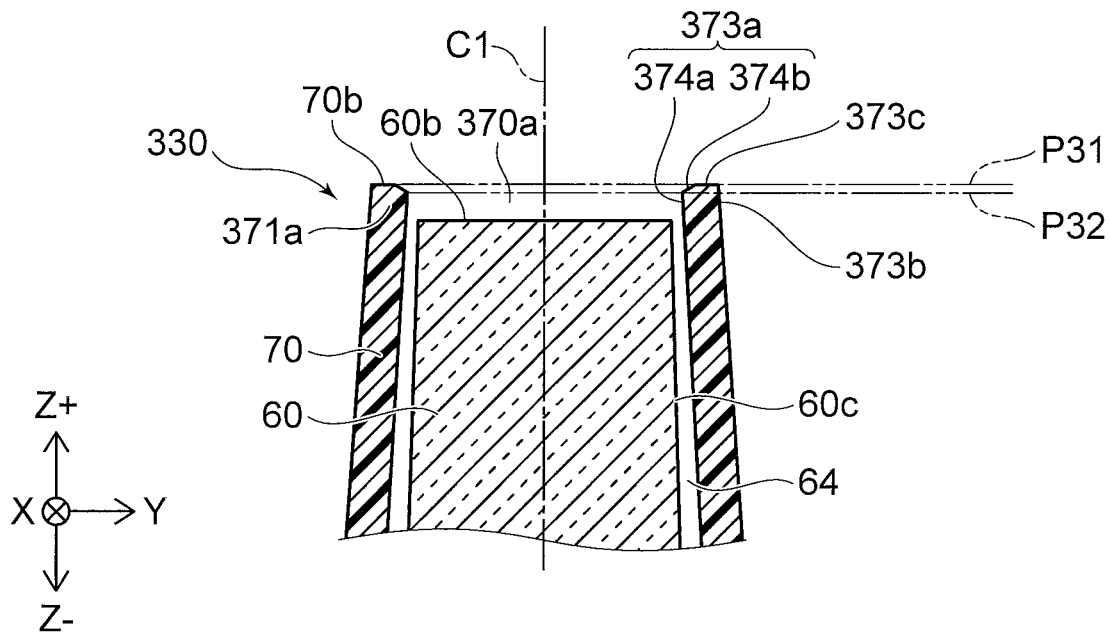
FIG. 12 is an end view showing a portion of a light source unit according to a second embodiment.

FIG. 12 is an end view showing a portion of a light source unit according to the embodiment.

The shape of a protruding portion 371a of the light-shielding body 70 of the light source unit 330 according to the embodiment is different from the shape of the protruding portion 71a according to the first embodiment.

An opening 370a that exposes the entire region of the second end surface 60b is provided in the protruding portion 371a of the light-shielding body 70. The surfaces of the protruding portion 371a include a surface (a portion 373a of the inner surface of the light-shielding body 70) facing the opening 370a, a portion 373b of the outer surface of the light-shielding body 70, and a tip surface 373c.

The portion 373a of the inner surface includes a first region 374a inclined with respect to the first direction Z+ to approach the axis C1 toward the first direction Z+, and a second region 374b that is positioned between the first region 374a and the tip surface 373c and is inclined with respect to the first direction Z+ away from the axis C1 toward the first direction Z+. For example, the portion 373b of the outer surface is inclined to approach the axis C1 toward the first direction Z+. The tip surface 373c is located between the portion 373a of the inner surface and the portion 373b of the outer surface and contacts the portion 373a of the inner surface and the portion 373b of the outer surface. The tip surface 373c is, for example, a plane that is orthogonal to the first direction Z+.

The shape of the portion 373a of the inner surface is not limited to that described above. For example, a step may be provided in the portion 373a of the inner surface. Also, the portion 373a of the inner surface may be curved away from the axis C1 toward the first direction Z+.

Hereinbelow, a plane that is orthogonal to the first direction Z+ and is positioned at the same position as the tip 70b (the tip surface 373c) in the first direction Z+ is called a first plane P31. Also, the surface area of the opening 370a at the first plane P21 is called the "first surface area". Also, a second plane P32 at which the surface area of the opening 370a is less than the first surface area exists between the tip 70b and the second end surface 60b. According to the embodiment, the second plane P32 is, for example, a plane at which the surface area of the XY plane is a minimum and is, for example, a plane that includes the second direction Z– side edge of the second region 374b. The surface area of the opening 370a at the second plane P32 is called the "second surface area".

The first surface area of the opening 370a at the first plane P31 is greater than the second surface area of the opening 370a at the second plane P32. The outer perimeter of the opening 370a at the first plane P31 is positioned outward of the outer perimeter of the opening 370a at the second plane P32 when viewed from the second direction Z.

Operations of the lighting device according to the embodiment will now be described.

Figure 13:
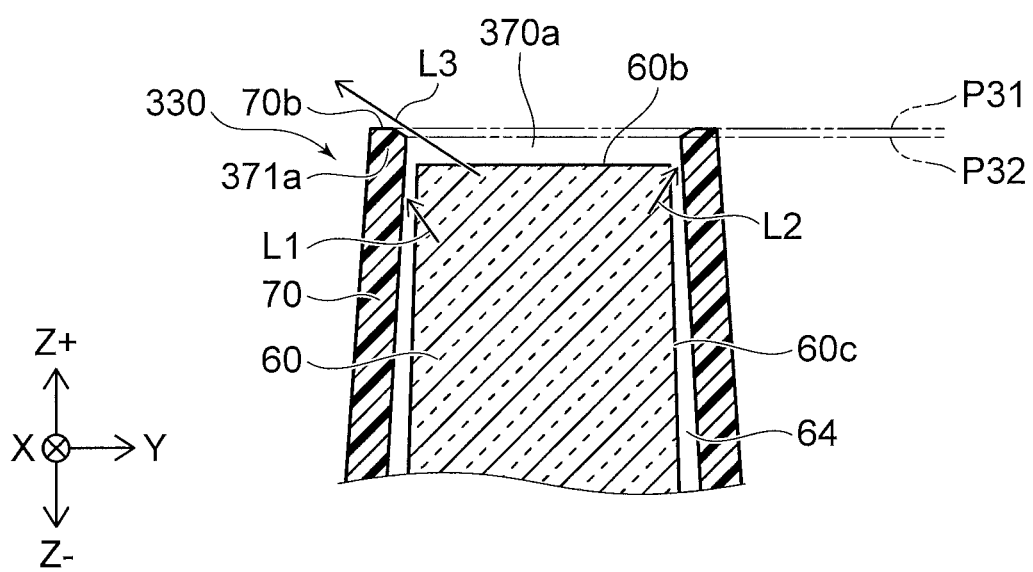
FIG. 13 is a schematic view showing light emitted from a rod lens of the light source unit according to the second embodiment.

FIG. 13 is a schematic view showing light emitted from a rod lens of the light source unit according to the embodiment.

As shown by arrow LA in FIG. 13, there are cases where a portion of the light incident on the first end surface 60a is emitted from the side surface 60c. According to the embodiment, the light-shielding body 70 absorbs the light emitted from the side surface 60c.

Furthermore, as shown by arrow L2, there are cases where light is emitted from a region of the side surface 60c at the vicinity of the second end surface 60b. According to the embodiment, the light-shielding body 70 includes the protruding portion 371a that protrudes further in the first direction Z+ than the second end surface 60b of the rod lens 60. Therefore, the light that is emitted from the region of the side surface 60c at the vicinity of the second end surface 60b also can be absorbed by the light-shielding body 70.

Furthermore, the first surface area of the opening 370a at the first plane P31 is greater than the second surface area of the opening 370a at the second plane P32. Thereby, as shown by arrow L3, the shielding by the protruding portion 371a of the light emitted from the second end surface 60b in directions crossing the first direction Z+ can be suppressed.

Effects of the embodiment will now be described.

The light-shielding body 70 does not cover the entire region of the second end surface 60b. Therefore, compared to the light source unit 30 according to the first embodiment, the light extraction efficiency of the light source unit 330 according to the embodiment is high.

Also, the smallest surface area of the opening 370a is at the second plane P32. Also, the second plane P32 is positioned between the tip 70b and the second end surface 60b in the first direction Z+. Thereby, the light-shielding body 70 can shield the greater part of the light emitted from the side surface 60c.

For example, the invention can be utilized in a dental lighting device, etc.

The invention claimed is:

1. A light source unit, comprising:
a first light-emitting element and a second light-emitting element;
a rod lens including
a first end surface, light emitted from the first and second light-emitting elements being incident on the first end surface,
a second end surface positioned at a side opposite to the first end surface, and
a side surface positioned between the first end surface and the second end surface, a surface area of the second end surface being less than a surface area of the first end surface; and
a light-shielding body separated from the side surface,
the light-shielding body covering the side surface,
the light-shielding body including an opening that exposes at least a portion of the second end surface,
the light-shielding body including a tip that protrudes further than the second end surface in a first direction,
the first direction being from the first end surface toward the second end surface,
a first plane crossing the first direction and being positioned at a same position as the tip in the first direction,
a second plane crossing the first direction and being positioned at a same position as the second end surface in the first direction or between the tip and the second end surface, and
a first surface area of the opening at the first plane being greater than a second surface area of the opening at the second plane.

2. A light source module, comprising:
the light source unit according to claim 1; and
an optical member projecting the light emitted from the light source unit.

3. The light source module according to claim 2, wherein the optical member includes:
a light-transmitting member including
a first surface on which light emitted from the light source unit is incident,
a second surface emitting the light, and
a third surface positioned at a side opposite to the second surface, and
a mirror layer located at the third surface of the light-transmitting member.

4. The light source module according to claim 3, wherein the light that is incident on the first surface undergoes a total internal reflection at the second surface, and
the light that undergoes the total internal reflection at the second surface is reflected by the mirror layer and emitted from the second surface.

5. A lighting device, comprising:
the light source module according to claim 2; and
a holding member holding the light source module.

6. The lighting device according to claim 5, wherein the lighting device is a dental lighting device.

7. The light source unit according to claim 1, wherein the light-shielding body covers a rim portion of the second end surface.

8. The light source unit according to claim 7, wherein a region positioned between the first plane and the second plane of a surface of the light-shielding body facing the opening is oblique to the first direction.

9. The light source unit according to claim 7, wherein a step is provided in a region positioned between the first plane and the second plane of a surface of the light-shielding body facing the opening.

10. The light source unit according to claim 7, wherein a region positioned between the first plane and the second plane of a surface of the light-shielding body facing the opening is curved.

11. The light source unit according to claim 7, wherein an outer perimeter of the opening at the first plane when viewed from a second direction is positioned outward of an outer perimeter of the opening at the second plane, and
the second direction is from the second end surface toward the first end surface.

12. The light source unit according to claim 1, wherein the light-shielding body does not cover an entire region of the second end surface, and
the opening has a smallest surface area at the second plane.

13. The light source unit according to claim 12, wherein a region positioned between the first plane and the second plane of a surface of the light-shielding body facing the opening is oblique to the first direction.

14. The light source unit according to claim 1, wherein a region positioned between the first plane and the second plane of a surface of the light-shielding body facing the opening is oblique to the first direction.

15. The light source unit according to claim 14, wherein an angle between the first direction and the region positioned between the first plane and the second plane of the surface of the light-shielding body facing the opening is not less than 45 degrees but less than 90 degrees.

16. The light source unit according to claim 1, wherein a step is provided in a region positioned between the first plane and the second plane of a surface of the light-shielding body facing the opening.

17. The light source unit according to claim 1, wherein a region positioned between the first plane and the second plane of a surface of the light-shielding body facing the opening is curved.

18. The light source unit according to claim 1, wherein an outer perimeter of the opening at the first plane when viewed from a second direction is positioned outward of an outer perimeter of the opening at the second plane, and
the second direction is from the second end surface toward the first end surface.

19. The light source unit according to claim 1, wherein an outer perimeter of the second end surface of the rod lens when viewed from a second direction is positioned inward of an outer perimeter of the first end surface of the rod lens, and
the second direction is from the second end surface toward the first end surface.

20. The light source unit according to claim 1, wherein a color temperature of the light emitted from the first light-emitting element is different from a color temperature of the light emitted from the second light-emitting element.

* * * * *